United States Patent
Grobis et al.

(10) Patent No.: US 11,355,188 B2
(45) Date of Patent: Jun. 7, 2022

(54) ONE SELECTOR ONE RESISTOR RAM THRESHOLD VOLTAGE DRIFT AND OFFSET VOLTAGE COMPENSATION METHODS

(71) Applicant: SanDisk Technologies LLC, Addison, TX (US)

(72) Inventors: Michael K. Grobis, Campbell, CA (US); Daniel Bedau, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/245,651

(22) Filed: Apr. 30, 2021

(65) Prior Publication Data

US 2021/0249073 A1    Aug. 12, 2021

Related U.S. Application Data

(62) Division of application No. 16/556,376, filed on Aug. 30, 2019, now Pat. No. 11,004,508.

(51) Int. Cl.
*G11C 11/16* (2006.01)
*G11C 13/00* (2006.01)
(Continued)

(52) U.S. Cl.
CPC ........ *G11C 13/004* (2013.01); *G11C 11/1673* (2013.01); *G11C 11/1675* (2013.01);
(Continued)

(58) Field of Classification Search
CPC ...................................................... G11C 11/16
(Continued)

(56) References Cited

U.S. PATENT DOCUMENTS 6,459,620 B1 * 10/2002 Eshel .................... G11C 16/28
                                                       365/185.2
9,460,784 B1    10/2016 Pellizzer
(Continued)

OTHER PUBLICATIONS

Requirement for Restriction dated Oct. 6, 2020 in U.S. Appl. No. 16/556,376.
(Continued)

*Primary Examiner* — Muna A Techane
(74) *Attorney, Agent, or Firm* — Vierra Magen Marcus LLP

(57) ABSTRACT

An apparatus is provided that includes a plurality of data arrays each comprising first memory cells, a plurality of read reference arrays each comprising second memory cells, a plurality of write reference arrays each comprising third memory cells, an access block comprising a memory cell from each of the plurality of data arrays, each of the plurality of read reference arrays, and each of the plurality of write reference arrays, and a memory controller. The memory controller is configured to determine a read threshold voltage to compensate a drift of a threshold voltage of the first memory cells, wherein the read threshold voltage is determined based on threshold voltages of a plurality of second memory cells, and a read offset voltage to compensate an offset voltage of the first memory cells, wherein the read offset voltage is determined based on offset voltages of a plurality of second memory cells.

20 Claims, 17 Drawing Sheets

(51) Int. Cl.
  *H01L 27/22* (2006.01)
  *H01L 27/24* (2006.01)
  *H01L 43/02* (2006.01)
(52) U.S. Cl.
  CPC ........ *G11C 13/0069* (2013.01); *H01L 27/224* (2013.01); *H01L 27/2409* (2013.01); *H01L 27/2481* (2013.01); *G11C 11/161* (2013.01); *G11C 2013/0054* (2013.01); *G11C 2213/15* (2013.01); *G11C 2213/71* (2013.01); *H01L 43/02* (2013.01)
(58) Field of Classification Search
  USPC ........................................... 365/148
  See application file for complete search history.

(56) References Cited

U.S. PATENT DOCUMENTS

| | | | |
|---|---|---|---|
| 10,115,461 B1 | 10/2018 | Lee et al. | |
| 2007/0237006 A1* | 10/2007 | Murin | G11C 11/5642 365/189.15 |
| 2010/0165719 A1 | 7/2010 | Pellizzer | |
| 2016/0093350 A1 | 3/2016 | Jung et al. | |
| 2018/0130541 A1 | 5/2018 | Li et al. | |
| 2018/0204616 A1 | 7/2018 | Park et al. | |
| 2019/0088299 A1* | 3/2019 | Antonyan | H01L 27/228 |

OTHER PUBLICATIONS

Response to Requirement for Restriction filed Nov. 23, 2020 in U.S. Appl. No. 16/556,376.
Office Action dated Dec. 10, 2020 in U.S. Appl. No. 16/556,376.
Response to Office Action filed Feb. 26, 2021 in U.S. Appl. No. 16/556,376.
Notice of Allowance dated Mar. 19, 2021 in U.S. Appl. No. 16/556,376.

* cited by examiner

ONE SELECTOR ONE RESISTOR RAM THRESHOLD VOLTAGE DRIFT AND OFFSET VOLTAGE COMPENSATION METHODS

PRIORITY CLAIM

This application is a divisional of U.S. patent application Ser. No. 16/556,376, entitled One Selector One Resistor Ram Threshold Voltage Drift And Offset Voltage Compensation Methods, now U.S. Pat. No. 11,004,508, which application is incorporated by reference herein in its entirety for all purposes.

BACKGROUND

Memory is widely used in various electronic devices such as cellular telephones, digital cameras, personal digital assistants, medical electronics, mobile computing devices, non-mobile computing devices and data servers. Memory may be non-volatile memory or volatile memory. A non-volatile memory allows information to be stored and retained even when the non-volatile memory is not connected to a source of power (e.g., a battery).

One example of a non-volatile memory is reversible resistance-switching memory, including magnetoresistive random access memory (MRAM) memory elements, phase change memory elements, reversible resistance-switching random access memory (ReRAM) memory elements, and other resistance-switching memory elements, in contrast to some other memory technologies that store data using electronic charge.

Generally, reversible resistance-switching memory includes a large number of memory cells formed on a semiconductor substrate, where each memory cell represents one bit of data. For MRAM memory, a bit of data is written to a memory cell by changing the direction of magnetization of a magnetic element within the memory cell, and a bit is read by measuring the resistance of the memory cell (low resistance typically represents a "0" bit, and high resistance typically represents a "1" bit). As used herein, direction of magnetization is the direction of orientation of the magnetic moment.

Although reversible resistance-switching memory is a promising technology, numerous design and process challenges remain.

DETAILED DESCRIPTION

Technology is described for compensating changes in the electrical properties of a memory cell that includes a reversible resistance-switching memory element coupled in series with a selector element.

A reversible resistance-switching element may include a reversible resistivity-switching material having a resistivity that may be reversibly switched between two or more states. In an embodiment, the reversible resistance-switching material may include a metal oxide, solid electrolyte, phase-change material, magnetic material, or other similar resistivity-switching material. Various metal oxides can be used, such as transition metal-oxides. Examples of metal-oxides include, but are not limited to, $NiO$, $Nb_2O_5$, $TiO_2$, $HfO_2$, $Al_2O_3$, $MgO_x$, $CrO_2$, $VO$, $BN$, $TaO_2$, $Ta_2O_3$, and $AlN$.

Figure 1A:
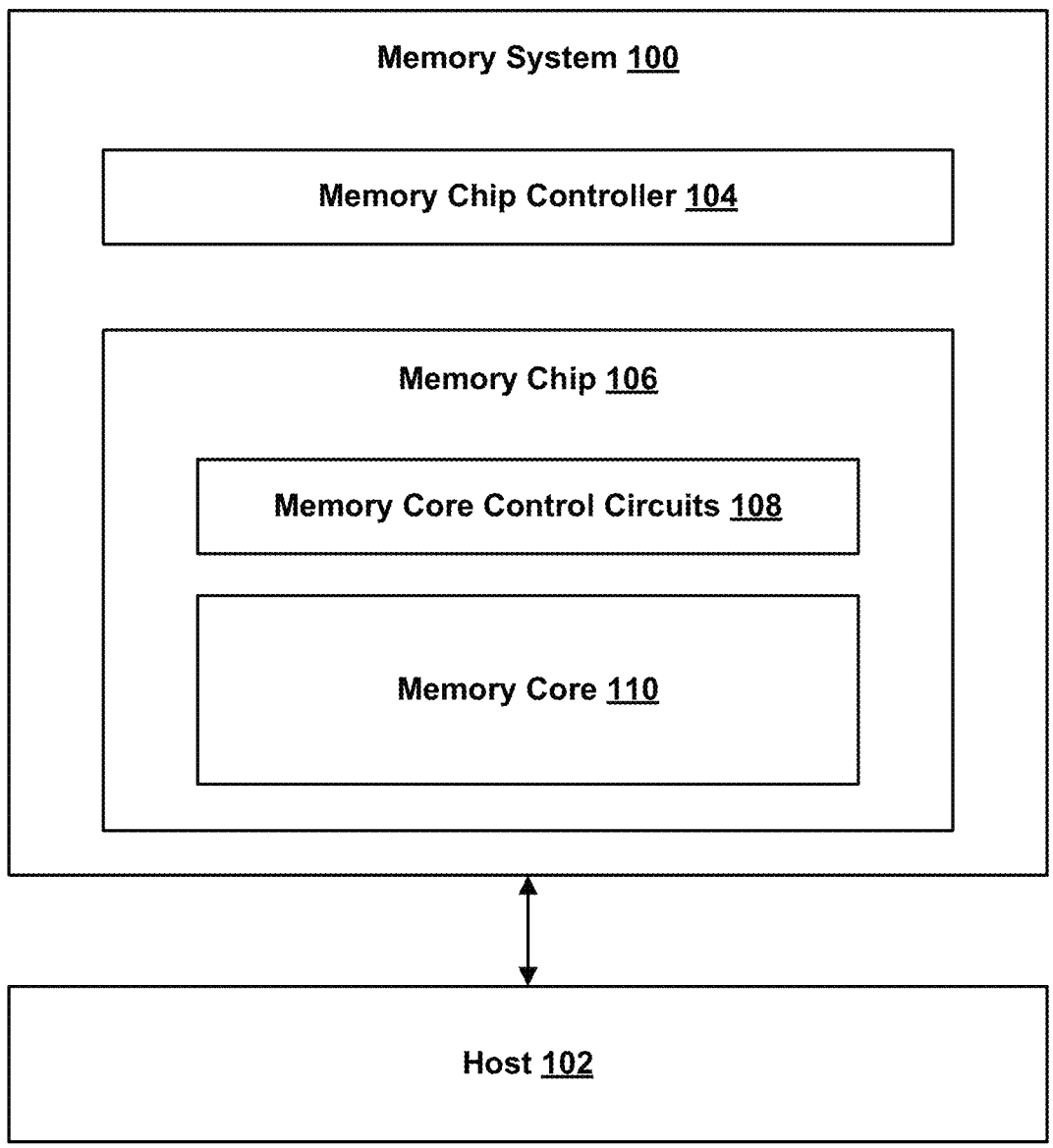
FIGS. 1A-1H depict various embodiments of a memory system.

FIG. 1A depicts one embodiment of a memory system 100 and a host 102. Memory system 100 may include a non-volatile storage system interfacing with host 102 (e.g., a mobile computing device or a server). In some cases, memory system 100 may be embedded within host 102. As examples, memory system 100 may be a memory card, a solid-state drive (SSD) such a high density MLC SSD (e.g., 2-bits/cell or 3-bits/cell) or a high performance SLC SSD, or a hybrid HDD/SSD drive.

As depicted, memory system 100 includes a memory chip controller 104 and a memory chip 106. Memory chip 106 may include volatile memory and/or non-volatile memory. Although a single memory chip is depicted, memory system 100 may include more than one memory chip. Memory chip controller 104 may receive data and commands from host 102 and provide memory chip data to host 102.

Memory chip controller 104 may include one or more state machines, page registers, SRAM, and control circuitry for controlling the operation of memory chip 106. The one or more state machines, page registers, SRAM, and control circuitry for controlling the operation of memory chip 106 may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit or arranged on a single die. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for selecting memory blocks (or arrays) within memory core 110, generating voltage references for biasing a particular memory array into a read or write state, and generating row and column addresses.

Memory core 110 may include one or more two-dimensional arrays of memory cells and/or one or more three-dimensional arrays of memory cells. In an embodiment, memory core control circuits 108 and memory core 110 may be arranged on a single integrated circuit. In other embodiments, memory core control circuits 108 (or a portion of memory core control circuits 108) and memory core 110 may be arranged on different integrated circuits.

A memory operation may be initiated when host 102 sends instructions to memory chip controller 104 indicating that host 102 would like to read data from memory system 100 or write data to memory system 100. In the event of a write (or programming) operation, host 102 may send to memory chip controller 104 both a write command and the data to be written. Memory chip controller 104 may buffer data to be written and may generate error correction code (ECC) data corresponding with the data to be written. In an embodiment, the data to be written may be stored in a first array (e.g., a "data array"), and corresponding ECC data may be stored in a second array (e.g., an "ECC array").

The ECC data, which allows data errors that occur during transmission or storage to be detected and/or corrected, may be written to memory core 110 or stored in non-volatile memory within memory chip controller 104. In an embodiment, the ECC data are generated and data errors are corrected by circuitry within memory chip controller 104.

Memory chip controller 104 may control operation of memory chip 106. For example, before issuing a write operation to memory chip 106, memory chip controller 104 may check a status register to make sure that memory chip 106 is able to accept the data to be written. In another example, before issuing a read operation to memory chip 106, memory chip controller 104 may pre-read overhead information associated with the data to be read. The overhead information may include ECC data corresponding to the data to be read or a redirection pointer to a new memory location within memory chip 106 for reading the requested data.

Once memory chip controller 104 initiates a read or write operation, memory core control circuits 108 may generate appropriate bias voltages for word lines and bit lines within memory core 110, as well as generate appropriate memory block, row, and column addresses.

In some embodiments, one or more managing or control circuits may be used for controlling the operation of a memory array within memory core 110. The one or more managing or control circuits may provide control signals to a memory array to perform a read operation and/or a write operation on the memory array. In one example, the one or more managing or control circuits may include any one of or a combination of control circuitry, state machines, decoders, sense amplifiers, read/write circuits, and/or controllers.

The one or more managing circuits may perform or facilitate one or more memory array operations including erasing, programming, or reading operations. For example, one or more managing circuits may include an on-chip memory controller for determining row and column address, word line and bit line addresses, memory array enable signals, and data latching signals.

Figure 1B:
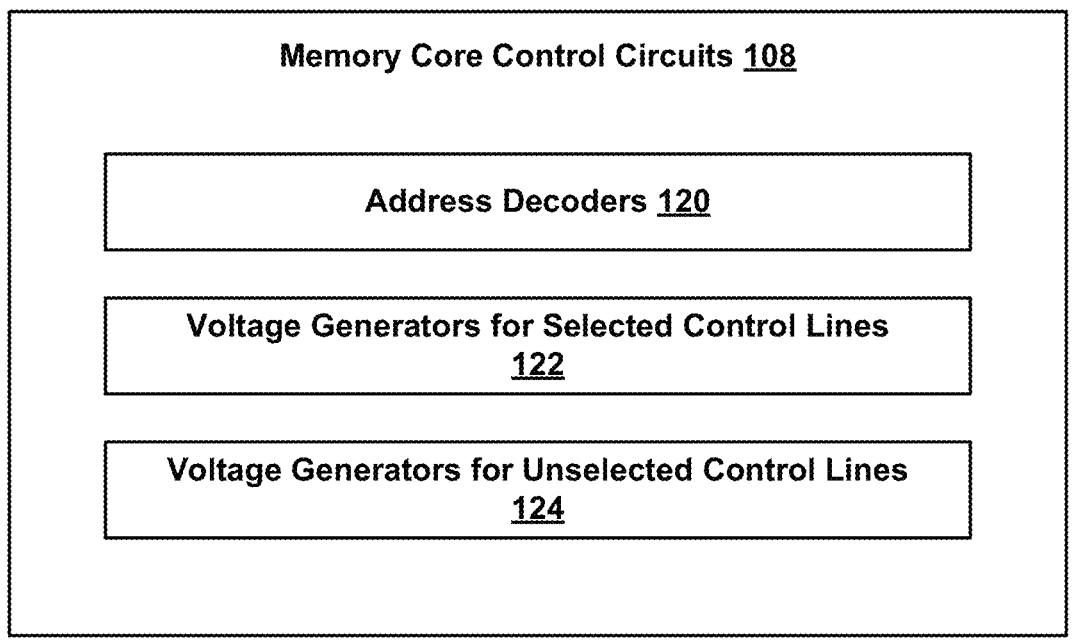

FIG. 1B depicts an embodiment of memory core control circuits 108. As depicted, memory core control circuits 108 include address decoders 120, voltage generators for selected control lines 122, and voltage generators for unselected control lines 124. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state.

Address decoders 120 may generate memory block addresses, as well as row addresses and column addresses for a particular memory block. Voltage generators (or voltage regulators) for selected control lines 122 may include one or more voltage generators for generating selected control line voltages. Voltage generators for unselected control lines 124 may include one or more voltage generators for generating unselected control line voltages.

FIGS. 1C-1F depict one embodiment of a memory core organization that includes a memory core 110 having multiple memory bays, and each memory bay having multiple memory blocks. Although a memory core organization is disclosed where memory bays include memory blocks, and memory blocks include a group of memory cells, other organizations or groupings also can be used with the technology described herein.

Figure 1C:
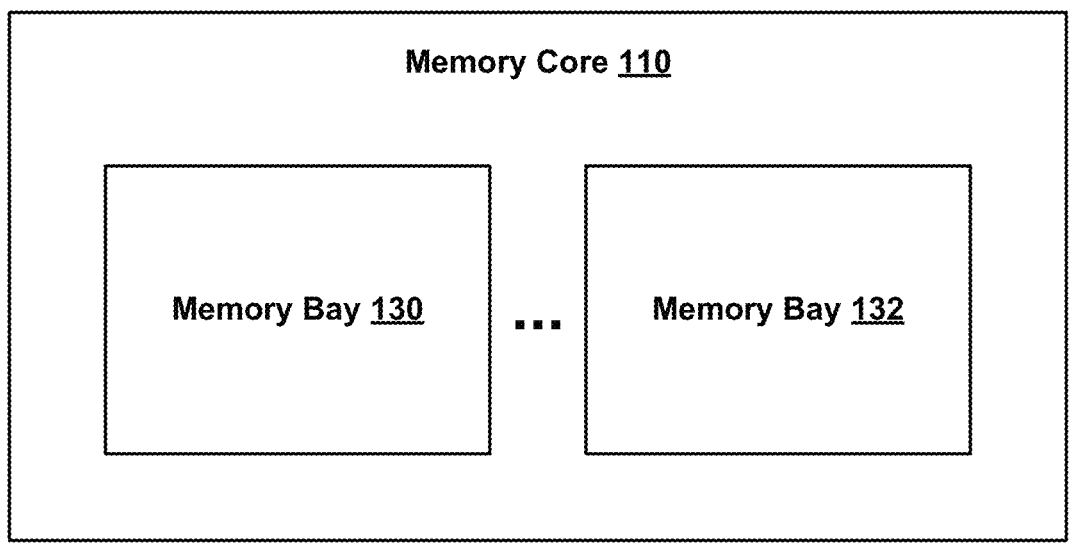

FIG. 1C depicts an embodiment of memory core 110 of FIG. 1A. As depicted, memory core 110 includes memory bay 130 and memory bay 132. In some embodiments, the number of memory bays per memory core can be different for different implementations. For example, a memory core may include only a single memory bay or multiple memory bays (e.g., 16 memory bays, 256 memory bays, etc.).

Figure 1D:
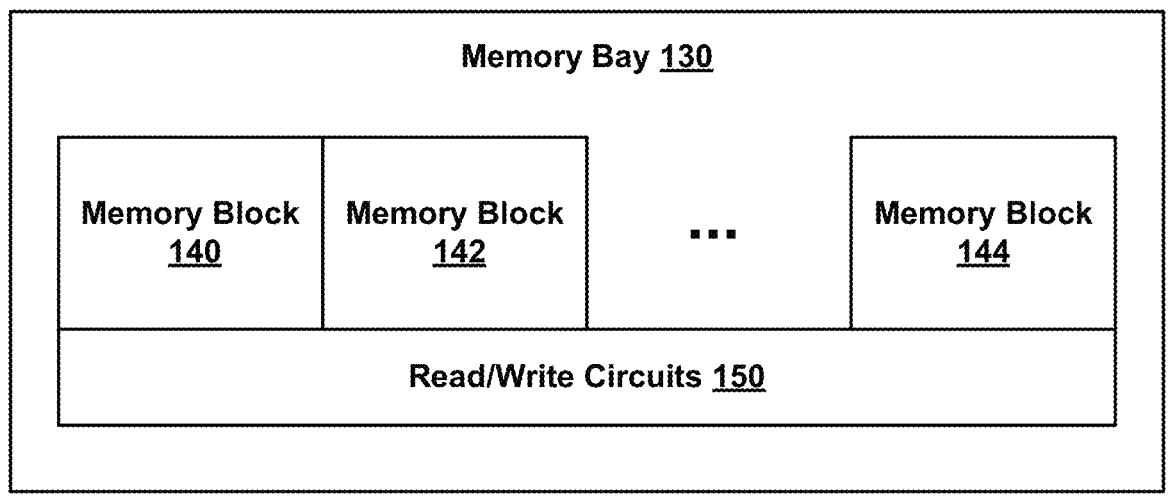

FIG. 1D depicts one embodiment of memory bay 130 of FIG. 1C. As depicted, memory bay 130 includes memory blocks 140-144 and read/write circuits 150. In some embodiments, the number of memory blocks per memory bay may be different for different implementations. For example, a memory bay may include one or more memory blocks (e.g., 32 memory blocks per memory bay).

Read/write circuits 150 include circuitry for reading and writing memory cells within memory blocks 140-144. As depicted, read/write circuits 150 may be shared across multiple memory blocks within a memory bay. This allows chip area to be reduced because a single group of read/write circuits 150 may be used to support multiple memory blocks. However, in some embodiments, only a single memory block may be electrically coupled to read/write circuits 150 at a particular time to avoid signal conflicts.

In some embodiments, read/write circuits 150 may be used to write one or more pages of data into memory blocks 140-144 (or into a subset of the memory blocks). The memory cells within memory blocks 140-144 may permit direct over-writing of pages (i.e., data representing a page or a portion of a page may be written into memory blocks 140-144 without requiring an erase or reset operation to be performed on the memory cells prior to writing the data).

In an example, memory system 100 of FIG. 1A may receive a write command including a target address and a set of data to be written to the target address. Memory system 100 may perform a read-before-write (RBW) operation to read the data currently stored at the target address before performing a write operation to write the set of data to the target address. Memory system 100 may then determine whether a particular memory cell may stay at its current state (i.e., the memory cell is already at the correct state), needs to be set to a "0" state, or needs to be reset to a "1" state.

Memory system 100 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells.

A particular memory cell may be set to the "1" state by applying a first voltage difference across the particular memory cell of a first polarity (e.g., +3.0V). The particular memory cell may be reset to the "0" state by applying a second voltage difference across the particular memory cell of a second polarity that is opposite to that of the first polarity (e.g., −3.0V).

In some cases, read/write circuits 150 may be used to program a particular memory cell to be in one of three or more data/resistance states (i.e., the particular memory cell may comprise a multi-level memory cell). For example, read/write circuits 150 may apply a first voltage difference (e.g., 4V) across the particular memory cell to program the particular memory cell to a first state of the three or more data/resistance states, or a second voltage difference (e.g., 3V) across the particular memory cell that is less than the first voltage difference to program the particular memory cell to a second state of the three or more data/resistance states.

Applying a smaller voltage difference across the particular memory cell may cause the particular memory cell to be partially programmed or programmed at a slower rate than when applying a larger voltage difference. In another example, read/write circuits 150 may apply a first voltage difference across the particular memory cell for a first time period (e.g., 150 ns) to program the particular memory cell to a first state of the three or more data/resistance states, or apply the first voltage difference across the particular memory cell for a second time period less than the first time period (e.g., 50 ns). One or more programming pulses followed by a memory cell verification phase may be used to program the particular memory cell to be in the correct state.

Figure 1E:
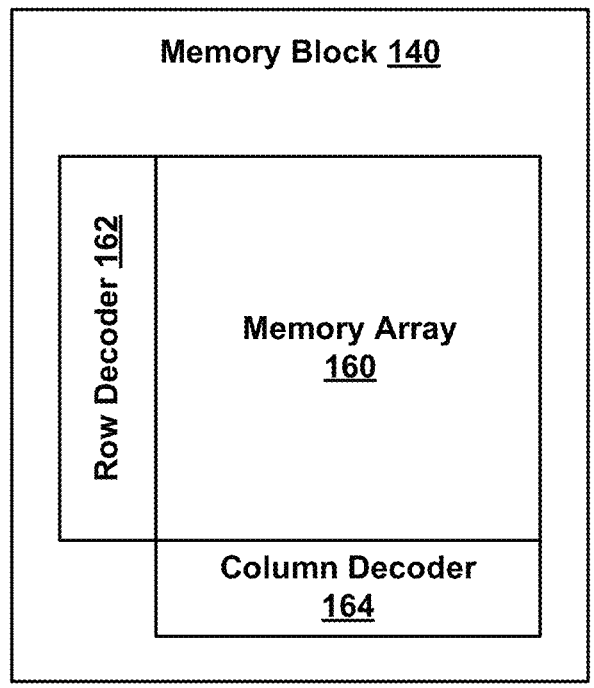

FIG. 1E depicts an embodiment of memory block 140 of FIG. 1D. As depicted, memory block 140 includes a memory array 160, a row decoder 162, and a column decoder 164. Memory array 160 may include a contiguous group of memory cells having contiguous word lines and bit lines. Memory array 160 may include one or more layers of memory cells, and may include a two-dimensional memory array and/or a three-dimensional memory array.

Row decoder 162 decodes a row address and selects a particular word line in memory array 160 when appropriate (e.g., when reading or writing memory cells in memory array 160). Column decoder 164 decodes a column address and selects a particular group of bit lines in memory array 160 to be electrically coupled to read/write circuits, such as read/write circuits 150 of FIG. 1D. In an embodiment, the number of word lines is 4K per memory layer, the number of bit lines is 1K per memory layer, and the number of memory layers is 4, providing a memory array 160 containing 16M memory cells. Other numbers of word lines per layer, bit lines per layer, and number of layers may be used.

Figure 1F:
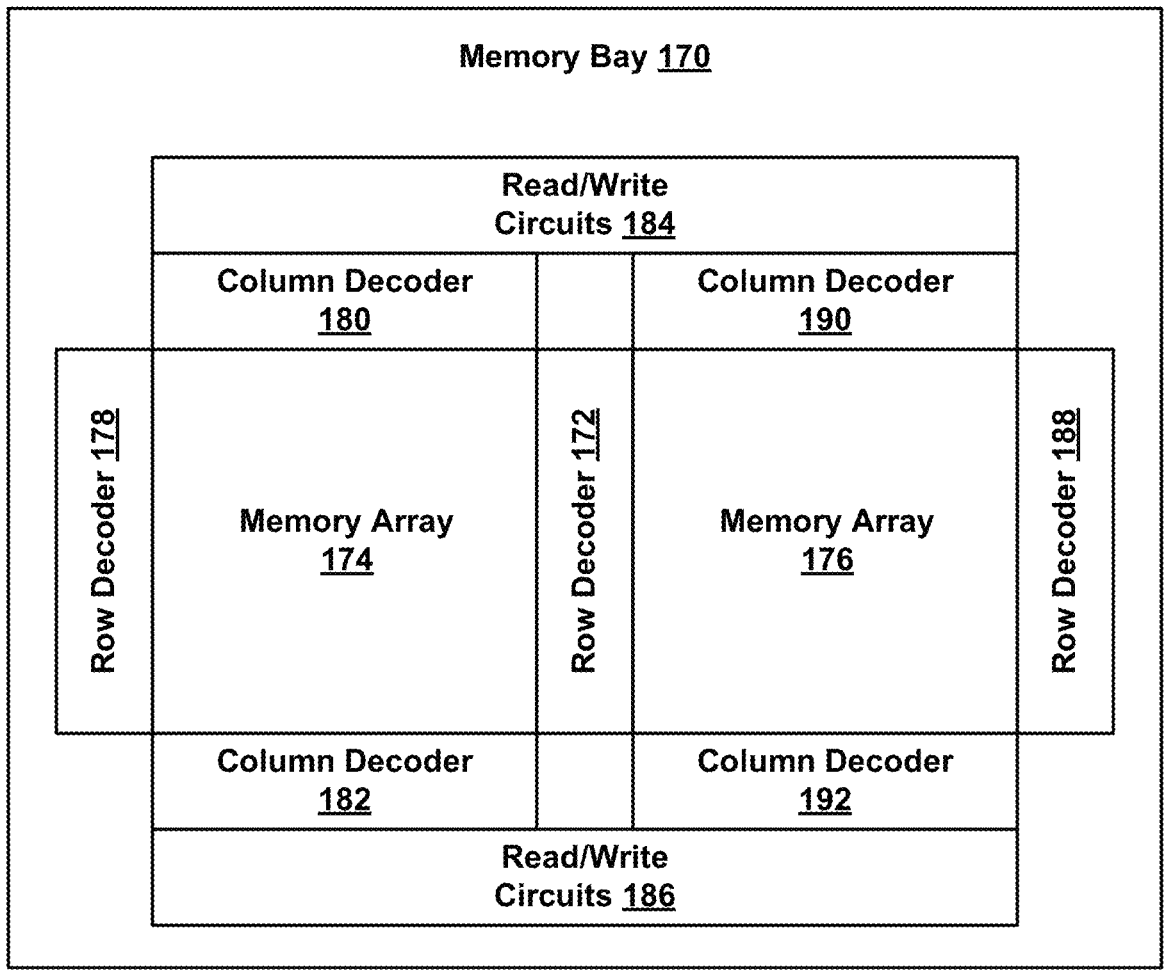

FIG. 1F depicts an embodiment of a memory bay 170. Memory bay 170 is an example of an alternative implementation for memory bay 130 of FIG. 1D. In some embodiments, row decoders, column decoders, and read/write circuits may be split or shared between memory arrays. As depicted, row decoder 172 is shared between memory arrays 174 and 176, because row decoder 172 controls word lines in both memory arrays 174 and 176 (i.e., the word lines driven by row decoder 172 are shared).

Row decoders 178 and 172 may be split such that even word lines in memory array 174 are driven by row decoder 178 and odd word lines in memory array 174 are driven by row decoder 172. Column decoders 180 and 182 may be split such that even bit lines in memory array 174 are controlled by column decoder 182 and odd bit lines in memory array 174 are driven by column decoder 180. The selected bit lines controlled by column decoder 180 may be electrically coupled to read/write circuits 184. The selected bit lines controlled by column decoder 182 may be electrically coupled to read/write circuits 186. Splitting the read/write circuits into read/write circuits 184 and 186 when the column decoders are split may allow for a more efficient layout of the memory bay.

Row decoders 188 and 172 may be split such that even word lines in memory array 176 are driven by row decoder 188 and odd word lines in memory array 176 are driven by row decoder 172. Column decoders 190 and 192 may be split such that even bit lines in memory array 176 are controlled by column decoder 192 and odd bit lines in memory array 176 are driven by column decoder 190. The selected bit lines controlled by column decoder 190 may be electrically coupled to read/write circuits 184. The selected bit lines controlled by column decoder 192 may be electrically coupled to read/write circuits 186. Splitting the read/write circuits into read/write circuits 184 and 186 when the column decoders are split may allow for a more efficient layout of the memory bay.

Figure 1G:
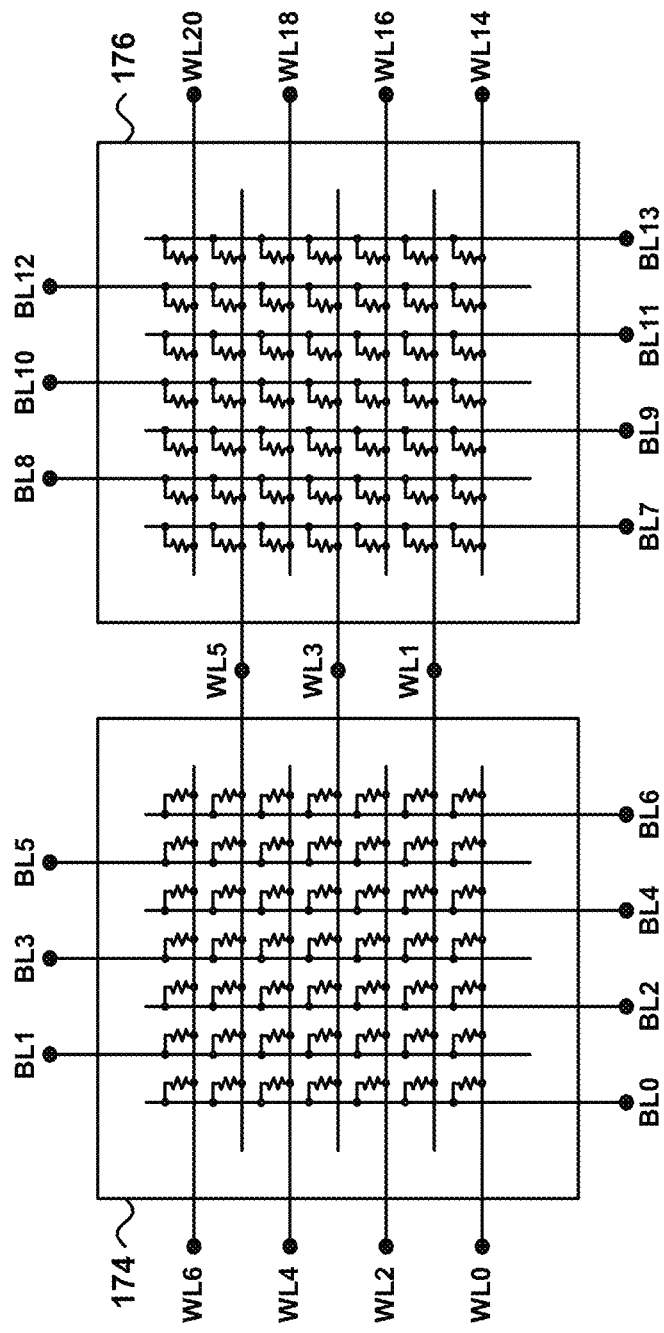

FIG. 1G depicts an embodiment of a schematic diagram (including word lines and bit lines) corresponding with memory bay 170 in FIG. 1F. As depicted, word lines WL1, WL3, and WL5 are shared between memory arrays 174 and 176 and controlled by row decoder 172 of FIG. 1F. Word lines WL0, WL2, WL4, and WL6 are driven from the left side of memory array 174 and controlled by row decoder 178 of FIG. 1F. Word lines WL14, WL16, WL18, and WL20 are driven from the right side of memory array 176 and controlled by row decoder 188 of FIG. 1F.

Bit lines BL0, BL2, BL4, and BL6 are driven from the bottom of memory array 174 and controlled by column decoder 182 of FIG. 1F. Bit lines BL1, BL3, and BL5 are driven from the top of memory array 174 and controlled by column decoder 180 of FIG. 1F. Bit lines BL7, BL9, BL11, and BL13 are driven from the bottom of memory array 176 and controlled by column decoder 192 of FIG. 1F. Bit lines BL8, BL10, and BL12 are driven from the top of memory array 176 and controlled by column decoder 190 of FIG. 1F.

In an embodiment, memory arrays 174 and 176 may include memory layers that are oriented in a plane that is horizontal to the supporting substrate. In another embodiment, memory arrays 174 and 176 may include memory layers that are oriented in a plane that is vertical with respect to the supporting substrate (i.e., the vertical plane is substantially perpendicular to the supporting substrate). In this case, the bit lines of the memory arrays may include substantially vertical bit lines.

Figure 1H:
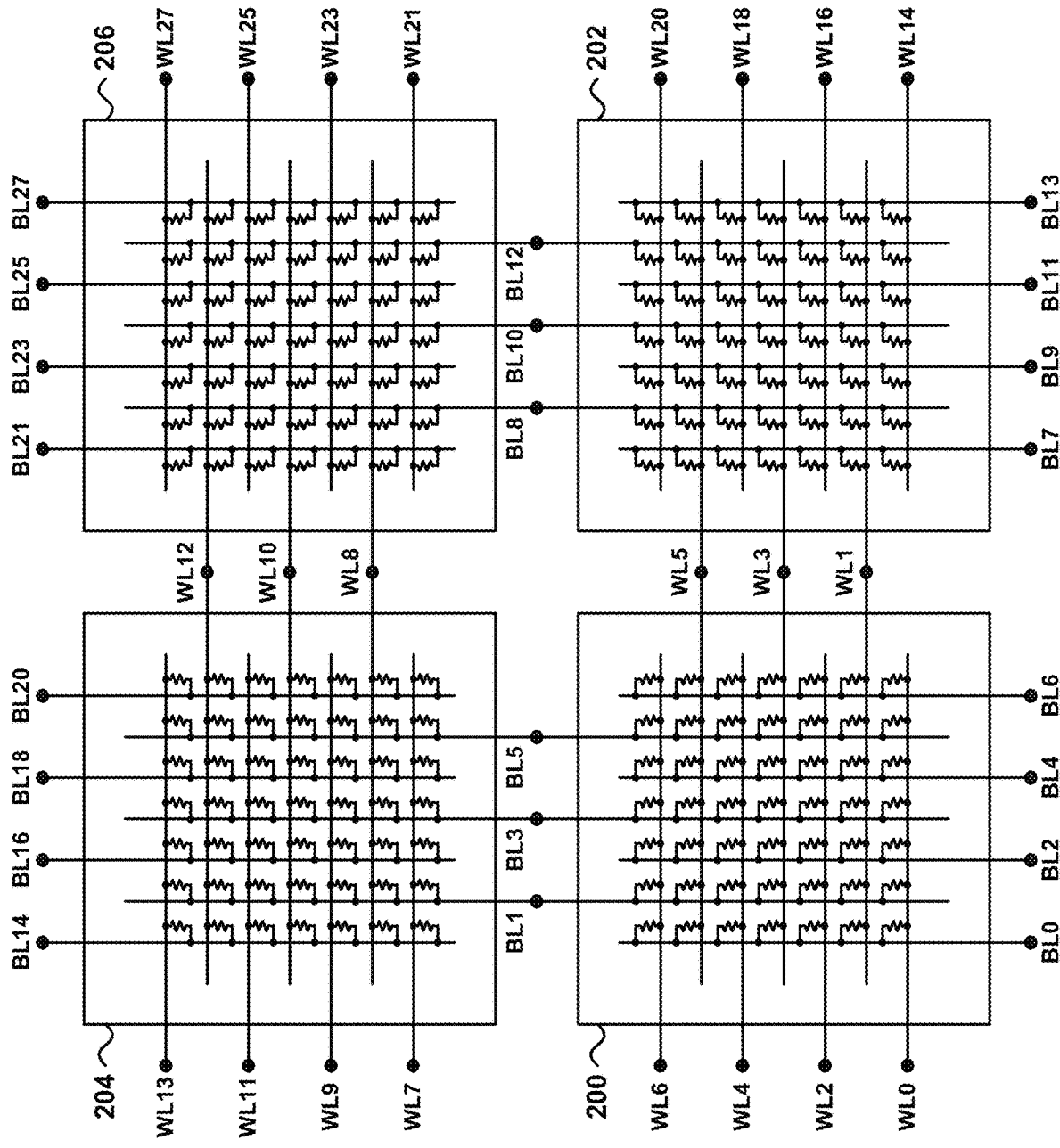

FIG. 1H depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area because a single row decoder and/or column decoder can be used to support two memory arrays.

As depicted, word lines WL1, WL3, and WL5 are shared between memory arrays 200 and 202. Bit lines BL1, BL3, and BL5 are shared between memory arrays 200 and 204. Word lines WL8, WL10, and WL12 are shared between memory arrays 204 and 206. Bit lines BL8, BL10, and BL12 are shared between memory arrays 202 and 206.

Row decoders are split such that word lines WL0, WL2, WL4, and WL6 are driven from the left side of memory array 200 and word lines WL1, WL3, and WL5 are driven from the right side of memory array 200. Likewise, word lines WL7, WL9, WL11, and WL13 are driven from the left side of memory array 204 and word lines WL8, WL10, and WL12 are driven from the right side of memory array 204.

Column decoders are split such that bit lines BL0, BL2, BL4, and BL6 are driven from the bottom of memory array 200 and bit lines BL1, BL3, and BL5 are driven from the top of memory array 200. Likewise, bit lines BL7, BL9, BL11, and BL13 are driven from the bottom of memory array 202 and bit lines BL8, BL10, and BL12 are driven from the top of memory array 202. Splitting row and/or column decoders also helps to relieve layout constraints (e.g., the column decoder pitch can be relieved by 2× since the split column decoders need only drive every other bit line instead of every bit line).

Figure 2A:
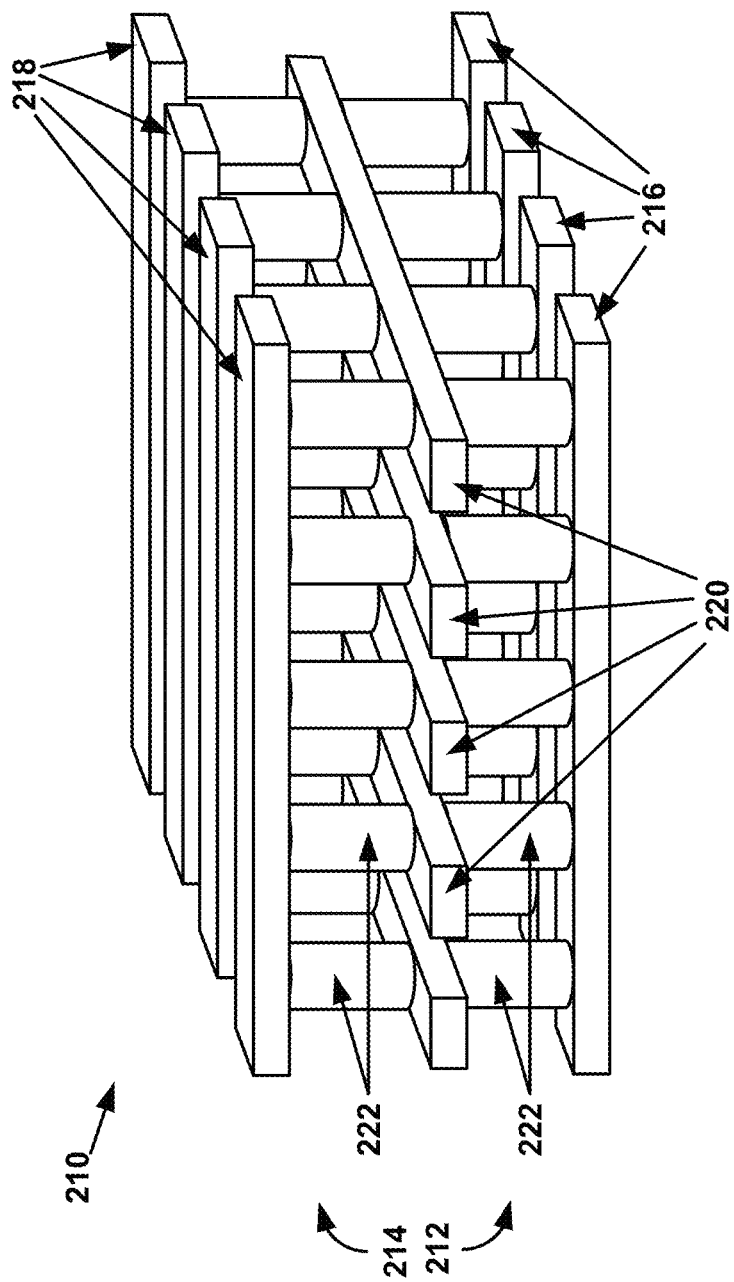
FIG. 2A depicts an embodiment of a portion of a three-dimensional memory array.

FIG. 2A depicts an embodiment of a portion of a monolithic three-dimensional memory array 210 that includes a first memory level 212, and a second memory level 214 positioned above first memory level 212. Memory array 210 is an example of an implementation of memory array 160 in FIG. 1E. Word lines 216 and 218 are arranged in a first direction and bit lines 220 are arranged in a second direction perpendicular to the first direction. As depicted, the upper conductors of first memory level 212 may be used as the lower conductors of second memory level 214. In a memory array with additional layers of memory cells, there would be corresponding additional layers of bit lines and word lines.

Memory array 210 includes a plurality of memory cells 222, each of which may include re-writeable memory cells. In an embodiment, each of memory cells 222 are vertically-oriented. Memory cells 222 may include non-volatile memory cells or volatile memory cells. With respect to first memory level 212, a first portion of memory cells 222 are between and connect to word lines 216 and bit lines 220. With respect to second memory level 214, a second portion of memory cells 222 are between and connect to word lines 218 and bit lines 220. In an embodiment, each memory cell 222 includes a reversible resistance-switching memory element coupled in series with a selector element, where each memory cell 222 represents one bit of data.

Figure 2B:
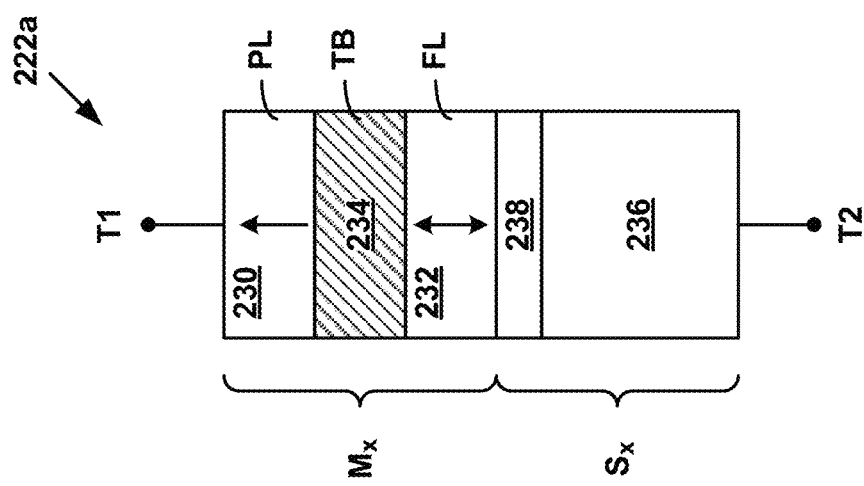
FIG. 2B depicts an embodiment of a memory cell of the three-dimensional memory array of FIG. 2A.

FIG. 2B is a simplified schematic diagram of a memory cell 222a, which is an example implementation of memory cells 222 of FIG. 2A. In an embodiment, memory cell 222a includes a reversible resistance-switching memory element coupled in series with a selector element $S_x$, both coupled between a first terminal T1 and a second terminal T2. In an embodiment, the reversible resistance-switching memory element is a magnetic memory element $M_x$. In other embodiments, other reversible resistance-switching memory elements (e.g., phase change memory elements, ReRAM memory elements, etc.) may be used. In an embodiment, memory cell 222a is vertically-oriented. In the embodiment of FIG. 2B, magnetic memory element $M_x$ is disposed above selector element $S_x$. In other embodiments, magnetic memory element $M_x$ may be disposed below selector element $S_x$.

In an embodiment, magnetic memory element $M_x$ is a magnetic tunnel junction, and selector element $S_x$ is a threshold selector device. In an embodiment, selector element $S_x$ is a conductive bridge threshold selector device. In other embodiments, selector element $S_x$ is an ovonic threshold switch (e.g., binary SiTe, CTe, BTe, AlTe, etc., or the ternary type AsGeSe, AsTeSi, AsTeGe or quaternary AsGeSeTe, AsTeGeSi, etc.), a Metal Insulator Transition (MIT) of a Phase Transition Material type (e.g., $VO_2$, $NbO_2$ etc.), or other similar threshold selector device.

In an embodiment, magnetic memory element $M_x$ includes an upper ferromagnetic layer 230, a lower ferromagnetic layer 232, and a tunnel barrier (TB) 234 which is an insulating layer between the two ferromagnetic layers. In this example, upper ferromagnetic layer 230 is a pinned (or fixed) layer (PL) that has a direction of magnetization that is not easily changed. Lower ferromagnetic layer 232 is a free layer (FL) that has a direction of magnetization that can be switched. In other embodiments, magnetic memory element $M_x$ may include fewer, additional, or different layers than those depicted in FIG. 2B. In other embodiments, lower ferromagnetic layer 232 is a pinned layer (PL) and upper ferromagnetic layer 230 is the free layer (FL).

When the direction of magnetization in free layer 232 is parallel to that of pinned layer 230, the resistance RP (referred to herein as "parallel resistance RP") across magnetic memory element $M_x$ is relatively low (referred to herein as a "low resistance state," or "LRS"). When the direction of magnetization in free layer 232 is anti-parallel to that of pinned layer 230, the resistance RAP (referred to herein as "anti-parallel resistance RAP") across magnetic memory element $M_x$ is relatively high (referred to herein as a "high resistance state," or "HRS"). The data state ("0" or "1") of magnetic memory element $M_x$ is read by measuring the resistance of magnetic memory element $M_x$. By design, both the parallel and anti-parallel configurations remain stable in the quiescent state and/or during a read operation (at sufficiently low read current).

In an embodiment, selector element $S_x$ is an ovonic threshold switch that includes a first region 236 and optionally includes a second region 238 disposed above first region 236. In an embodiment, first region 236 is a SiTe alloy, and optional second region 238 is carbon nitride. Other materials may be used for first region 236 and optional second region 238. In other embodiments, selector element $S_x$ is a conductive bridge threshold selector element. In an embodiment, first region 236 is a solid electrolyte region, and second region 238 is an ion source region.

Figure 2C:
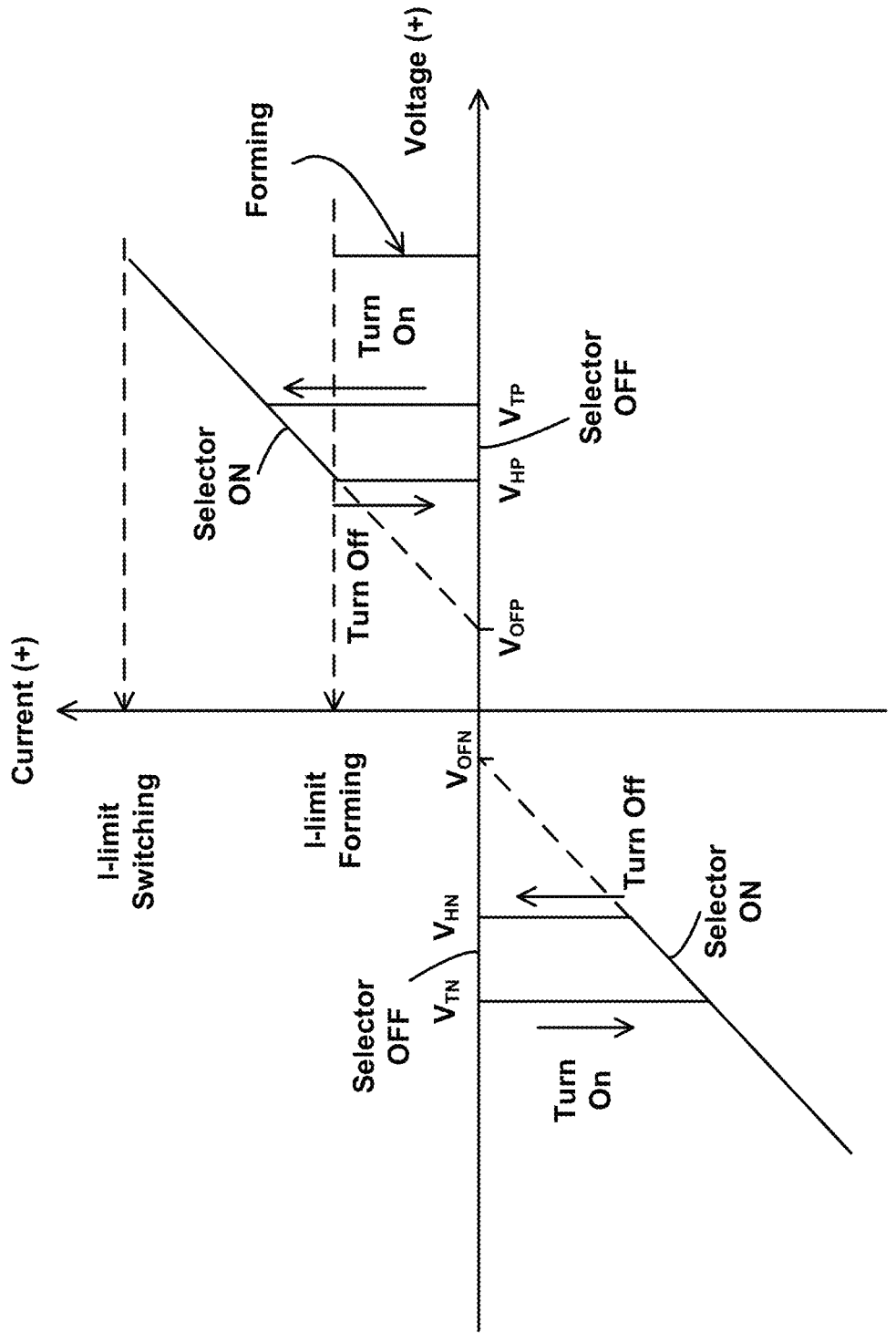
FIG. 2C depicts an example current-voltage characteristic of a threshold selector device of FIG. 2B.

FIG. 2C is a diagram depicting example current-voltage (I-V) characteristics of a threshold selector device $S_x$. Each threshold selector device $S_x$ is initially in a high resistance (OFF) state. To operate threshold selector device $S_x$ as a threshold switch, an initial forming or first-fire step may be necessary to initialize the threshold selector device $S_x$ at a voltage or current different from its subsequent operational range. Following forming, threshold selector device $S_x$ may be switched ON and OFF, and may be used as either a unipolar or a bipolar threshold selector device. Accordingly, threshold selector device $S_x$ may be referred to as a bipolar threshold selector device.

In the example I-V characteristics of FIG. 2C, for positive applied voltages, threshold selector device $S_x$ remains in an OFF state until the voltage across the device meets or exceeds (i.e., is more positive than) a first threshold voltage, $V_{TP}$, at which point threshold selector device $S_x$ switches to an ON state. Threshold selector device $S_x$ remains in the ON state until the voltage across the device drops to or below a first hold voltage, $V_{HP}$, at which point threshold selector device 224 switches to the OFF state. In the ON state an offset voltage $V_{OFP}$ is dropped across the selector. and is nearly independent of current across a nominal range of operation currents. Offset voltage $V_{OFP}$ can be estimated by extrapolating the I-V curve of the selector in in the ON state to zero current.

For negative applied voltages, threshold selector device $S_x$ remains in the OFF state until the voltage across the device meets or exceeds (i.e., is more negative than) a second threshold voltage, $V_{TN}$, at which point threshold selector device 304 switches to the ON state. Threshold selector device $S_x$ remains in the ON state until the voltage across the device increases to or exceeds (i.e., is less negative than) a second hold voltage, $V_{HN}$, at which point threshold selector device $S_x$ switches to the OFF state. In the ON state an offset voltage $V_{OFN}$ is dropped across the selector, and is nearly independent of current across a nominal range of operation currents. Offset voltage $V_{OFN}$ can be estimated by extrapolating the I-V curve of the selector in in the ON state to zero current.

Referring again to FIG. 2B, in an embodiment, magnetic memory element $M_x$ uses spin-transfer-torque (STT) switching. To "set" a bit value of magnetic memory element $M_x$ (i.e., choose the direction of the free layer magnetization), an electrical write current is applied from first terminal T1 to second terminal T2. The electrons in the write current become spin-polarized as they pass through pinned layer 230 because pinned layer 230 is a ferromagnetic metal.

A substantial majority of the conduction electrons coming from the ferromagnet will have a spin orientation that is parallel to the direction of magnetization in the ferromagnet, yielding a net spin polarized current. (Electron spin refers to angular momentum, which is directly proportional to but anti-parallel in direction to the magnetic moment of the electron, but this directional distinction will not be used going forward for ease of discussion.)

When the spin-polarized electrons tunnel across TB 234, conservation of angular momentum can result in the imparting of a torque on both free layer 232 and pinned layer 230, but this torque is inadequate (by design) to affect the direction of magnetization of pinned layer 230. Contrastingly, this torque is (by design) sufficient to switch the direction of magnetization of free layer 232 to become parallel to that of pinned layer 230 if the initial direction of magnetization of free layer 232 was anti-parallel to pinned layer 230. The parallel magnetizations will then remain stable before and after such write current is turned OFF.

In contrast, if free layer 232 and pinned layer 230 magnetizations are initially parallel, the direction of magnetization of free layer 232 can be STT-switched to become anti-parallel to that of pinned layer 230 by applying a write current of opposite direction to the aforementioned case. Thus, by way of the same STT physics, the direction of the magnetization of free-layer 232 can be deterministically set into either of two stable orientations by judicious choice of the write current direction (polarity).

In the example described above, spin-transfer-torque (STT) switching is used to "set" a bit value of magnetic memory element $M_x$. In other embodiments, field-induced switching, spin orbit torque (SOT) switching, VCMA (magnetoelectric) switching, or other switching techniques may be employed.

Figure 3A:
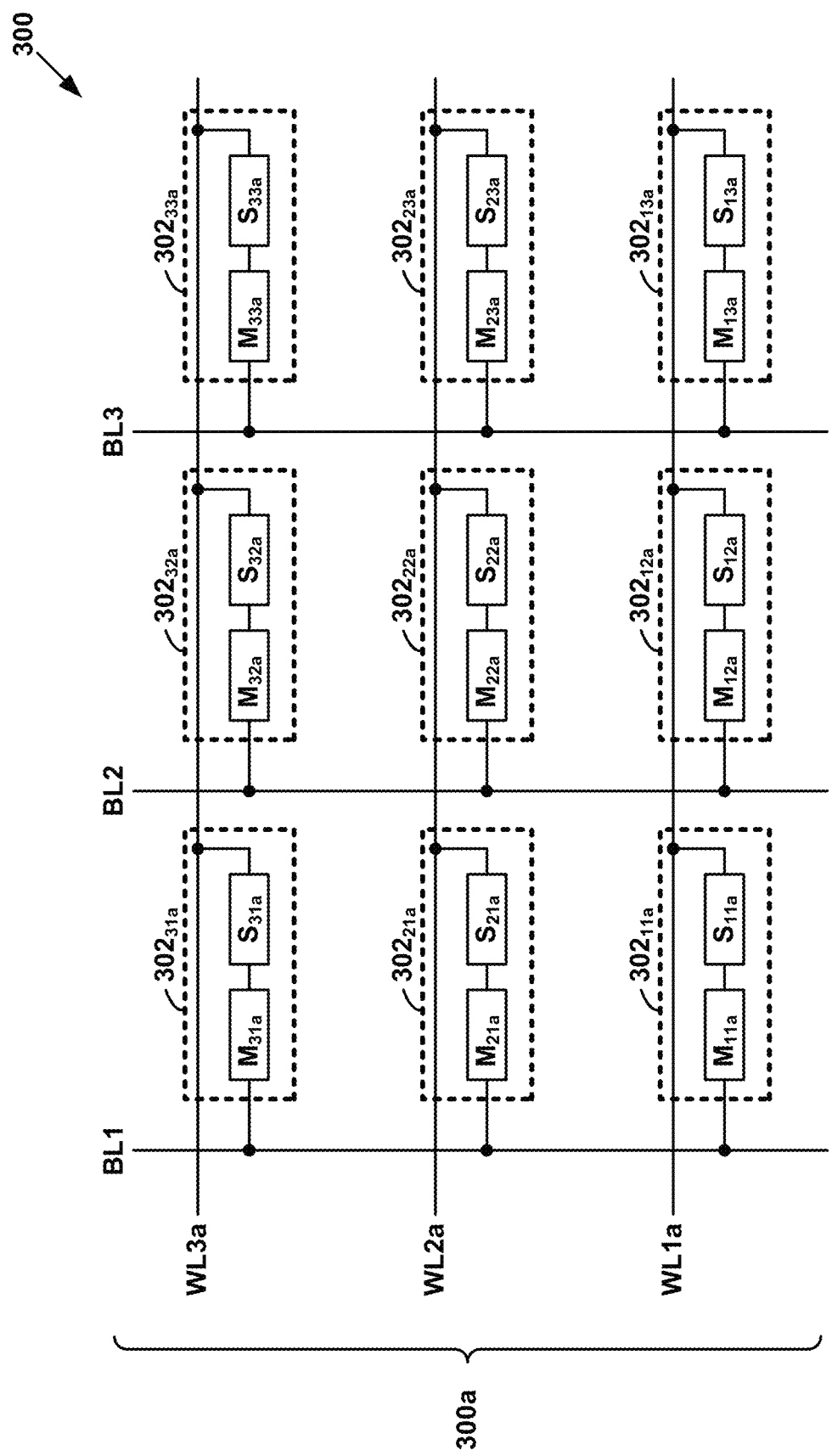
FIGS. 3A-3B depict an embodiment of a cross-point memory array.
Figure 3B:
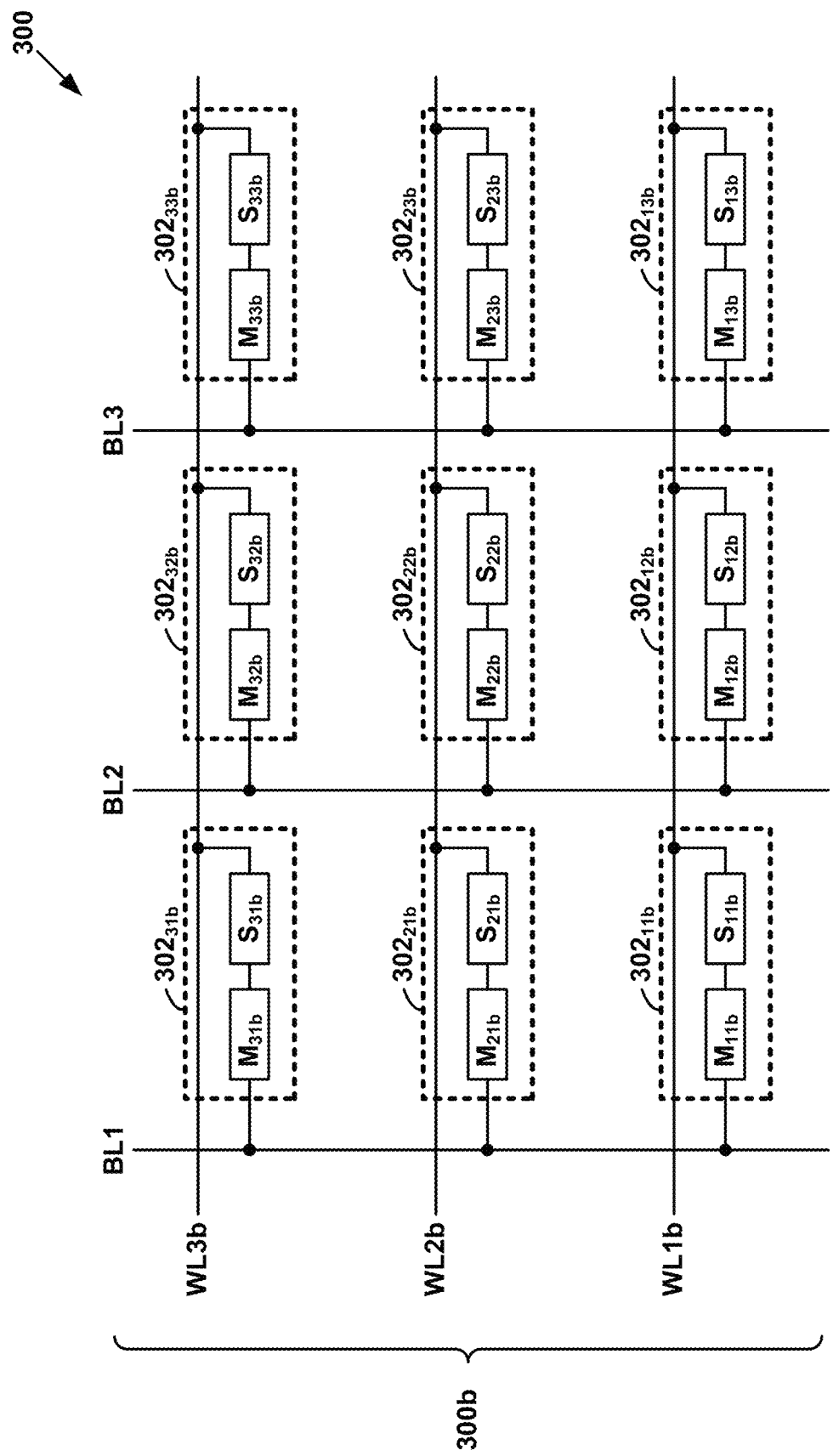

FIGS. 3A-3B are simplified schematic diagrams of an example cross-point memory array 300 which includes a first memory level 300a, and a second memory level 300b positioned above first memory level 300a. Cross-point memory array 300 is an example of an implementation of memory array 160 in FIG. 1E. Cross-point memory array 300 may include more than two memory levels.

Cross-point memory array 300 includes word lines WL1a, WL2a, WL3a, WL1b, WL2b, and WL3b, and bit lines BL1, BL2, and BL3. First memory level 300a includes memory cells $302_{11a}, 302_{12a}, \ldots, 302_{33a}$ coupled to word lines WL1a, WL2a, WL3a and bit lines BL1, BL2, and BL3, and second memory level 300b includes memory cells $302_{11b}, 302_{12b}, \ldots, 302_{33b}$ coupled to word lines WL1b, WL2b, WL3b and bit lines BL1, BL2, and BL3. In an embodiment, each of memory cells $302_{11a}, 302_{12a}, \ldots, 302_{33a}$ are vertically-oriented. In an embodiment, each of memory cells $302_{11b}, 302_{12b}, \ldots, 302_{33b}$ are vertically-oriented.

First memory level 300a is one example of an implementation for first memory level 212 of monolithic three-dimensional memory array 210 of FIG. 2B, and second memory level 300b is one example of an implementation for second memory level 214 of monolithic three-dimensional memory array 210 of FIG. 2B. In an embodiment, each of memory cells $302_{11a}, 302_{12a}, \ldots, 302_{33a}, 302_{11b}, 302_{12b}, \ldots, 302_{33b}$, is an implementation of memory cell 222a of FIG. 2B. Persons of ordinary skill in the art will understand that cross-point memory array 300 may include more or less than six word lines, more or less than three bit lines, and more or less than eighteen memory cells $302_{11a}, 302_{12a}, \ldots, 302_{33a}, 302_{11b}, 302_{12b}, \ldots, 302_{33b}$. In some embodiments, cross-point memory array 300 may include 1000×1000 memory cells, although other array sizes may be used.

Each memory cell $302_{11a}, 302_{12a}, \ldots, 302_{33a}, 302_{11b}, 302_{12b}, \ldots, 302_{33b}$ is coupled to one of the word lines and one of the bit lines, and includes a corresponding magnetic memory element $M_{11a}, M_{12a}, \ldots, M_{33a}, M_{11b}, M_{12b}, \ldots, M_{33b}$, respectively, coupled in series with a corresponding selector element $S_{11a}, S_{12a}, \ldots, S_{33a}, S_{11b}, S_{12b}, \ldots, S_{33b}$, respectively. In an embodiment, each of magnetic memory elements $M_{11a}, M_{12a}, \ldots, M_{33a}, M_{11b}, M_{12b}, \ldots, M_{33b}$ is an implementation of magnetic memory element $M_x$ of FIG. 2B, and each of selector elements $S_{11a}, S_{12a}, \ldots, S_{33a}, S_{11b}, S_{12b}, \ldots, S_{33b}$ is an implementation of selector element $S_x$ of FIG. 2B.

Each memory cell $302_{11a}, 302_{12a}, \ldots, 302_{33a}$ has a first terminal coupled to one of bit lines BL1, BL2, BL3, and a second terminal coupled to one of word lines WL1a, WL2a, WL3a, and each memory cell $302_{11b}, 302_{12b}, \ldots, 302_{33b}$ has a first terminal coupled to one of bit lines BL1, BL2, BL3, and a second terminal coupled to one of word lines WL1b, WL2b, WL3b. For example, memory cell $302_{13a}$ includes magnetic memory element $M_{13a}$ coupled in series with selector element $S_{13a}$, and includes a first terminal coupled to bit line BL3, and a second terminal coupled to word line WL1a.

Likewise, memory cell $302_{22b}$ includes magnetic memory element $M_{22b}$ coupled in series with selector element $S_{22b}$, and includes a first terminal coupled to bit line BL2, and a second terminal coupled to word line WL2b. Similarly, memory cell $302_{33a}$ includes magnetic memory element $M_{33a}$ coupled in series with selector element $S_{33a}$, and includes a first terminal coupled to bit line BL3, and a second terminal coupled to word line WL3a.

Magnetic memory elements $M_{11a}, M_{12a}, \ldots, M_{33a}$ may be disposed above or below corresponding selector elements $S_{11a}, S_{12a}, \ldots, S_{33a}$, respectively, and magnetic memory elements $M_{11b}, M_{12b}, \ldots, M_{33b}$, may be disposed above or below corresponding selector elements $S_{11b}, S_{12b}, \ldots, S_{33b}$, respectively. In an embodiment, the orientation of memory cells $302_{11a}, 302_{12a}, \ldots, 302_{33a}$ of first memory level 300a is the same as the orientation of memory cell $302_{11b}, 302_{12b}, \ldots, 302_{33b}$ of second memory level 300b. In another embodiment, the orientation of memory cells $302_{11a}, 302_{12a}, \ldots, 302_{33a}$ of first memory level 300a is opposite the orientation of memory cell $302_{11b}, 302_{12b}, \ldots, 302_{33b}$ of second memory level 300b.

As described above, memory cells 222a (FIG. 2B) each include a magnetic memory element $M_x$ coupled in series with a selector element $S_x$. In such memory cells 222a, properties of the magnetic memory element $M_x$ and selector element $S_x$ drift over time. In particular, the threshold voltage of a selector element $S_x$ will change (drift) with time since the last write operation to the selector element $S_x$. For example, following a write operation, the magnitude of the threshold voltage (e.g., $V_{TP}$ or $V_{TN}$ in FIG. 2C) of a selector element $S_x$ is at its lowest level. As time elapses, the magnitude of the threshold voltage will drift higher.

In addition to varying with time, the threshold voltage of a selector element $S_x$ also varies with temperature resulting in threshold voltages across a memory array varying with workload. Moreover, threshold voltage of a magnetic memory element $M_x$ also may vary due to intrinsic distributions, time drift, temperature variations, and cumulative stress (e.g. number of ON/OFF cycles). As a result, the threshold voltage drift limits the error rate that can be achieved in memory cells such as memory cells 222a of FIG. 2B.

Figure 4:
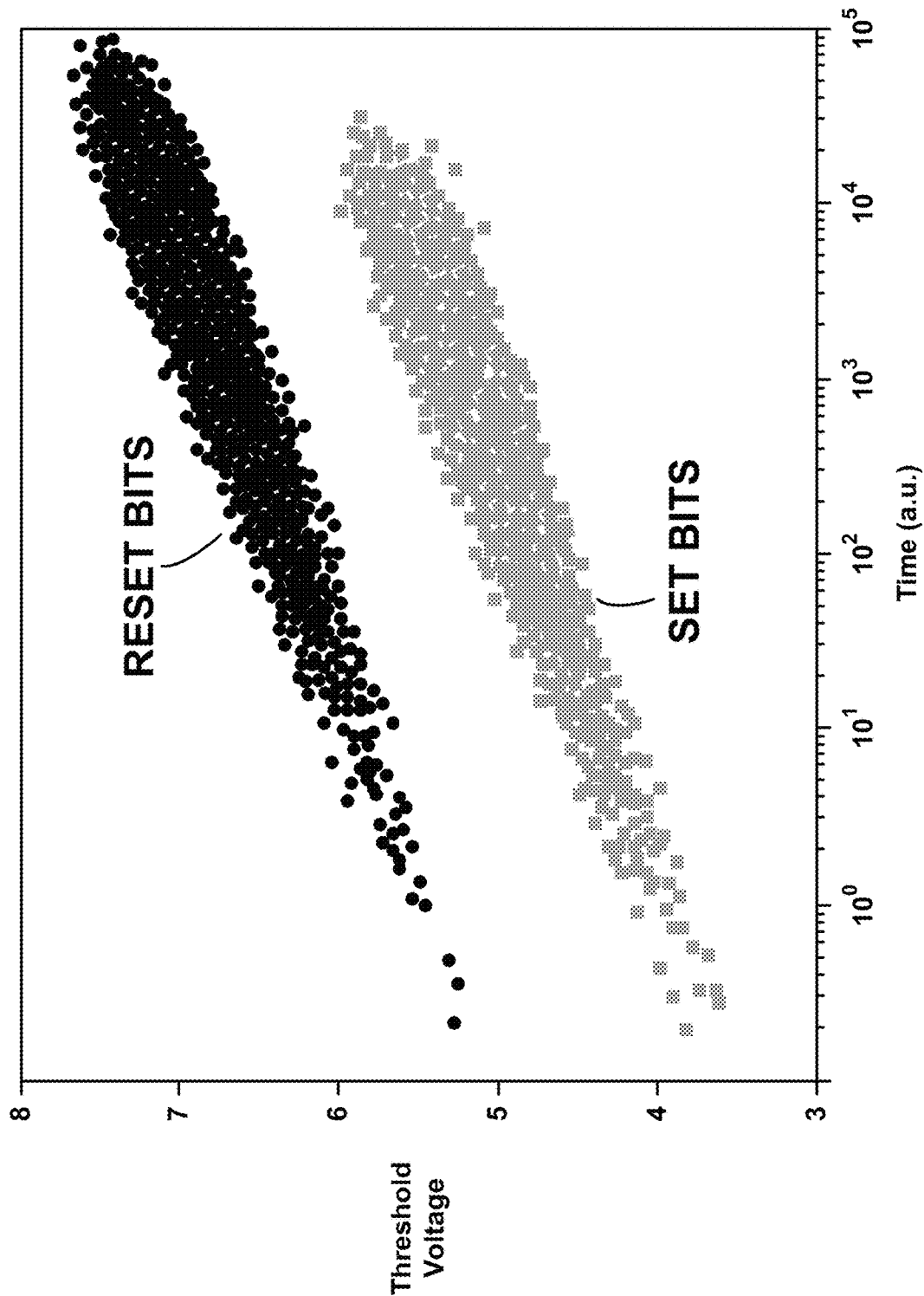
FIG. 4 is a diagram depicting example threshold voltage distributions for an array of memory cells.

FIG. 4 is a diagram illustrating example threshold voltage distributions versus time (in arbitrary time units, a.u.) for an array of memory cells (such as memory cells 222a of FIG. 2B). As illustrated in FIG. 4, the threshold voltage of memory cells 222a drift in both the SET and RESET states. If a fixed read voltage Vread (e.g., Vread=4.6V) is used to read memory cells 222a, SET bits and RESET bits can easily be distinguished immediately following a read or write operation. However, as time increases since the last read or write operation, a fixed read voltage Vread can no longer be used to accurately distinguish SET bits and RESET bits.

Indeed, in the example illustrated in FIG. 4, at about $10^2$ a.u., if a fixed read voltage Vread=4.6V is used, many SET bits cannot be distinguished from RESET bits. Instead, to reliably distinguish SET bits from RESET bits, the read voltage would need to be increased (e.g., to Vread=5.5V). Similarly, at about $10^4$ a.u. the read voltage would need to be further increased (e.g., to Vread=6.2V) to reliably distinguish SET bits from RESET bits.

In addition, as more time passes since read or write operation, the applied voltage or bias needed to selectively activate a memory cell increases due to the increased threshold voltage in the selector element $S_x$ of that memory cell. Activating a memory cell is sometimes referred to herein as thresholding the corresponding selector element $S_x$ of the memory cell as described above by providing an applied voltage, or bias, that exceeds a threshold voltage (e.g., $V_{TP}$ or $V_{TN}$ in FIG. 2C) of the selector element $S_x$.

In addition to the threshold voltage, offset voltage (e.g., $V_{OFP}$ and $V_{OFN}$ in FIG. 2C) also can change over time, limiting achievable bit error rates. The offset voltage can vary with temperature, time since last ON cycle, and cumulative stress (e.g. number of ON/OFF cycles). Uncertainty in the offset voltage limits the ability of the write circuits to apply desired write voltages or current to the memory cell, which can lead to unsuccessful write attempts if insufficient current is passed, or cell damage if excess current is applied. During reading, uncertainty in the offset voltage introduces errors in the deduced resistance value of the memory element. The read resistance uncertainty is detrimental to non-demarcated read schemes that require the selector to be in the ON state for both SET and RESET states of the memory.

Technology is described for compensating changes in the electrical properties of a memory cell, such as memory cell 222a of FIG. 2B, that includes a reversible resistance-switching memory element coupled in series with a selector element. In an embodiment, a memory system includes a first memory array including a first memory cell, a second memory array including a second memory cell, and a memory controller configured to determine a threshold voltage of the second memory cell to compensate a drift of a threshold voltage of the first memory cell. In some embodiments, the determined threshold voltage is used to set read voltages and/or maximum write voltages for the first memory cell. In some embodiments, the first memory array includes one or more data arrays and/or ECC arrays.

In another embodiment, the memory system includes a memory controller configured to determine the offset voltage of the second memory cell to compensate changes of the offset voltage of the first memory cell. In some embodiments, the determined offset voltage is used to compensate the write voltage applied to the first memory cell to improve write error rates and increase cell lifetime. In other embodiments, the determined offset voltage is used to compensate the extracted cell resistance during read to reduce read error rates.

Figure 5A:
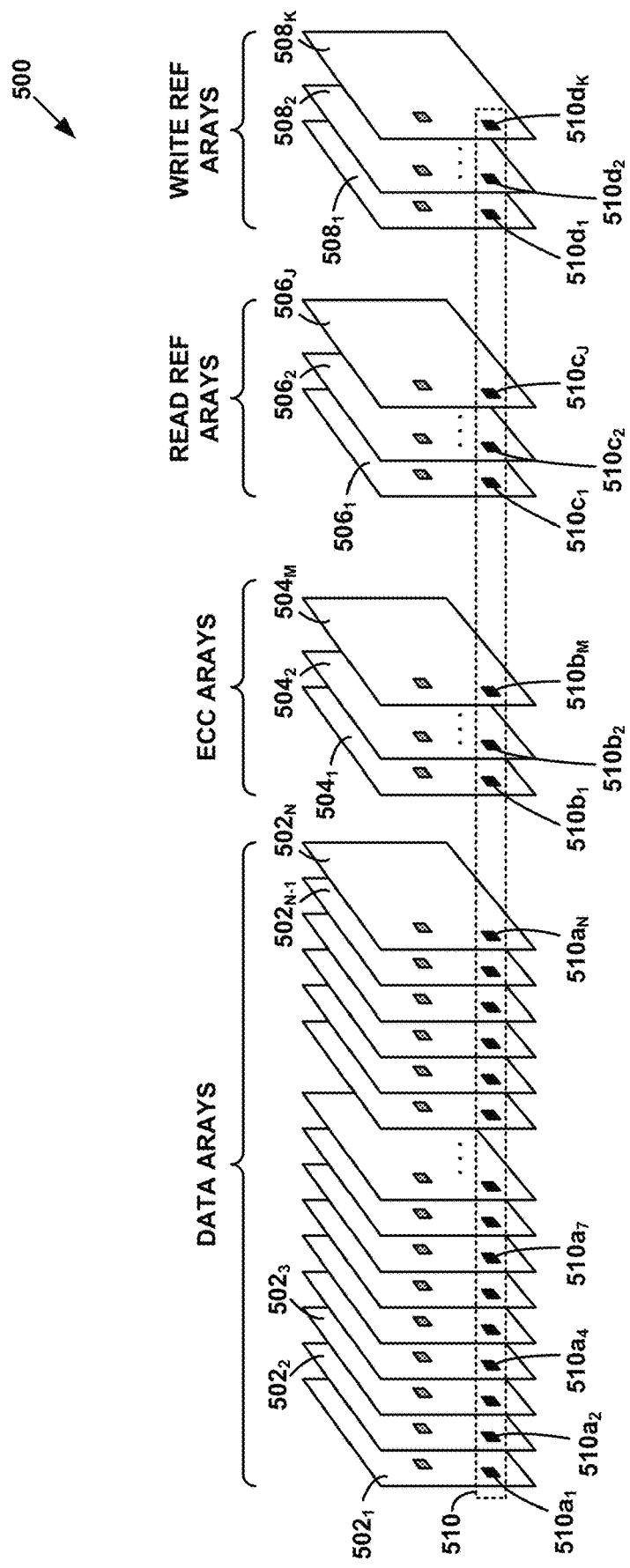
FIGS. 5A-5C depict a memory system including data arrays, ECC arrays, read reference arrays, and write reference arrays.
Figure 5B:
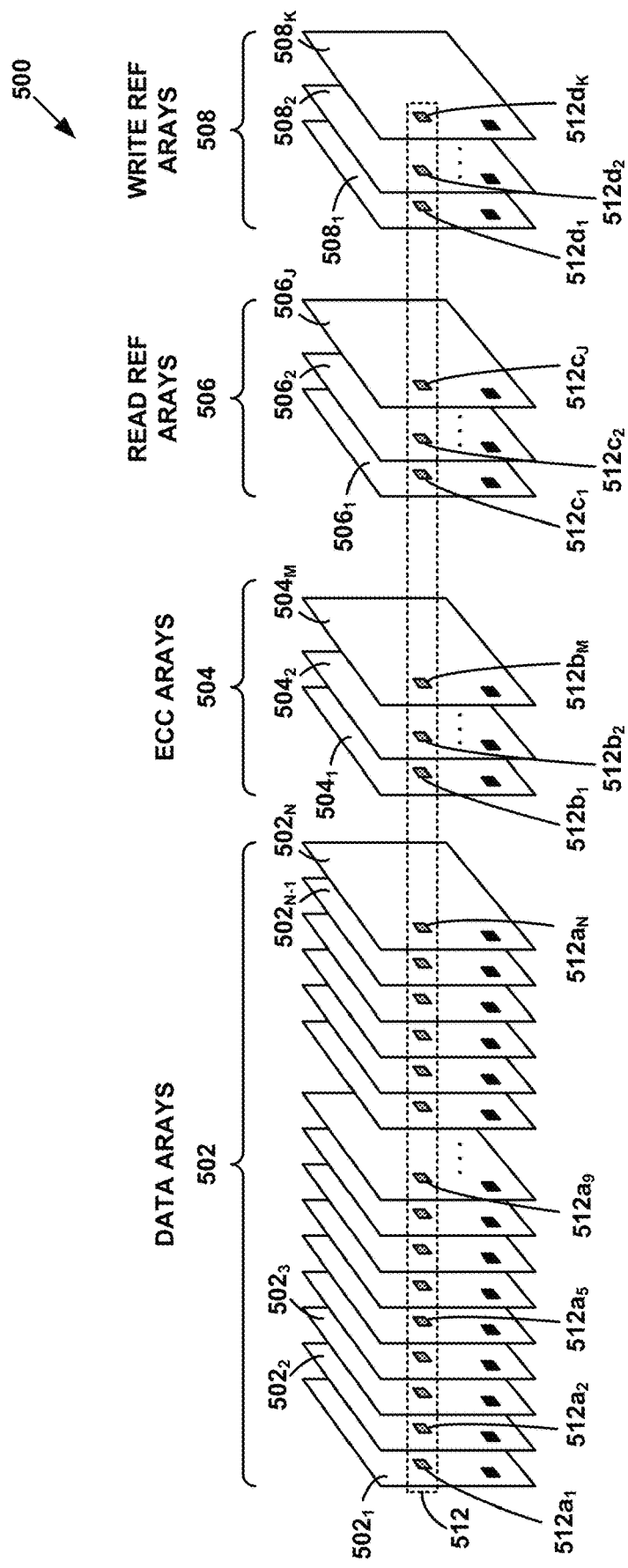
Figure 5C:
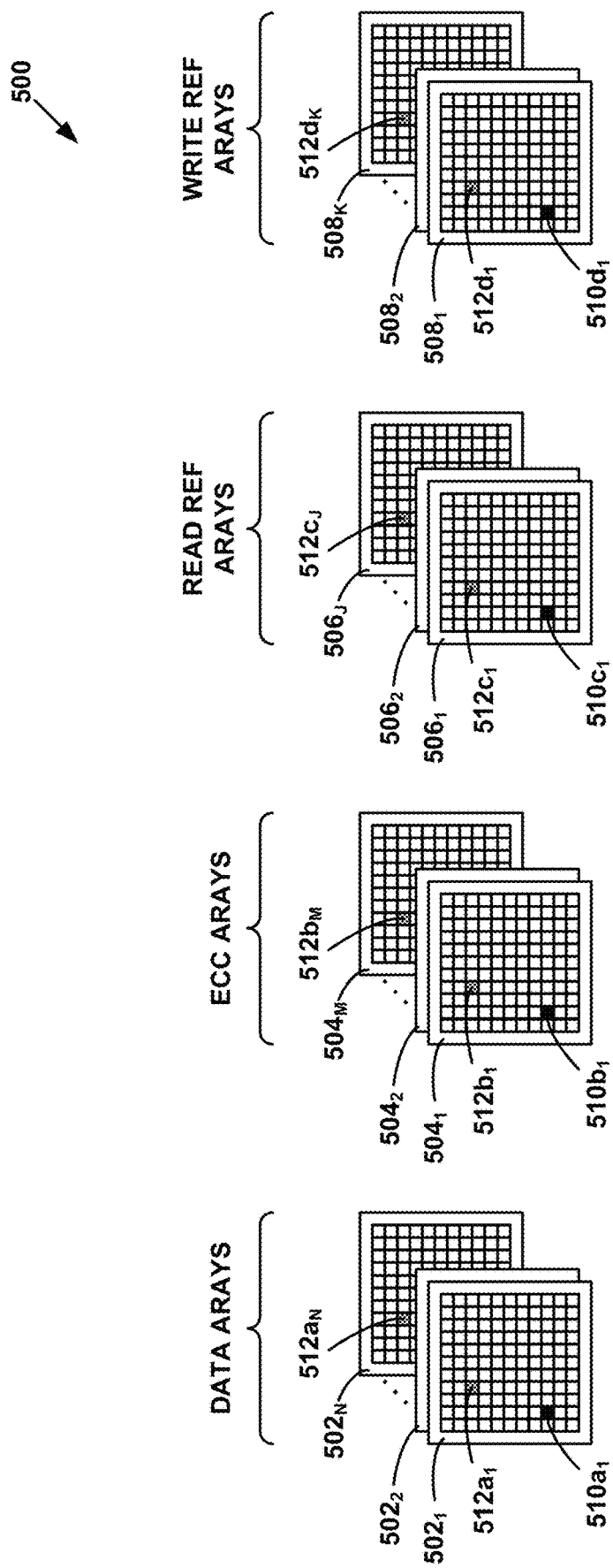

FIGS. 5A-5C depict a memory system 500 that includes first memory arrays (also referred to herein as "data arrays" and/or "ECC arrays"), second memory arrays (also referred to herein as "read reference arrays"), and third memory arrays (also referred to herein as "write reference arrays"). FIGS. 5A and 5B are identical to one another, but are separated to avoid overcrowding the drawings with reference numbers. FIG. 5C is a "flattened" view of the data arrays, ECC arrays, read reference arrays, and write reference arrays of FIGS. 5A-5B. In an embodiment, memory system 500 is part of memory core 110 of memory chip 106 (FIG. 1A).

In an embodiment, memory system 500 includes N data arrays $502_1, 502_2, \ldots, 502_N$ (e.g., N=256), M ECC arrays $504_1, 504_2, \ldots, 504_M$ (e.g., M=64), J read reference arrays $506_1, 506_2, \ldots, 506_J$ (e.g., J=2), and K memory write reference arrays $508_1, 508_2, \ldots, 508_K$ (e.g., K=2). Other values for N, M, J and K may be used. In other embodiments, ECC arrays $504_1, 504_2, \ldots, 504_M$ may be omitted. In an embodiment, data arrays $502_1, 502_2, \ldots, 502_N$, ECC arrays $504_1, 504_2, \ldots, 504_M$, read reference arrays $506_1, 506_2, \ldots, 506_J$, and write reference arrays $508_1, 508_2, \ldots, 508_K$ each include substantially identical memory arrays (e.g., cross-point arrays) of substantially identical memory cells. In an embodiment, data arrays $502_1, 502_2, \ldots, 502_N$, ECC arrays $504_1, 504_2, \ldots, 504_M$, read reference arrays $506_1, 506_2, \ldots, 506_J$, and write reference arrays $508_1, 508_2, \ldots, 508_K$ may be included in memory array 160 of FIG. 1E.

In an embodiment, data arrays $502_1, 502_2, \ldots, 502_N$, ECC arrays $504_1, 504_2, \ldots, 504_M$, read reference arrays $506_1, 506_2, \ldots, 506_J$, and write reference arrays $508_1, 508_2, \ldots, 508_K$ each include a 4096×4096 array of memory cells, although other memory array sizes may be used. To avoid overcrowding the drawings, data arrays $502_1, 502_2, \ldots, 502_N$, ECC arrays $504_1, 504_2, \ldots, 504_M$, read reference arrays $506_1, 506_2, \ldots, 506_J$, and write reference arrays $508_1, 508_2, \ldots, 508_K$ are depicted in FIG. 5C as including 11×11 memory arrays, with each memory cell depicted as a small square.

In embodiments, data arrays $502_1, 502_2, \ldots, 502_N$, ECC arrays $504_1, 504_2, \ldots, 504_M$, read reference arrays $506_1, 506_2, \ldots, 506_J$, and write reference arrays $508_1, 508_2, \ldots, 508_K$ each include one or more layers of memory cells, and include a two-dimensional memory array and/or a three-dimensional memory array. In an embodiment, read reference arrays $506_1, 506_2, \ldots, 506_J$ and write reference arrays $508_1, 508_2, \ldots, 508_K$ may include additional circuitry (not shown) for providing reference voltages and determining threshold voltages of memory cells in read reference arrays $506_1, 506_2, \ldots, 506_J$ and write reference arrays $508_1, 508_2, \ldots, 508_K$.

In an embodiment, each memory cell of data arrays $502_1, 502_2, \ldots, 502_N$, ECC arrays $504_1, 504_2, \ldots, 504_M$, read reference arrays $506_1, 506_2, \ldots, 506_J$, and write reference arrays $508_1, 508_2, \ldots, 508_K$ includes a reversible resistance-switching memory element coupled in series with a selector element. In an embodiment, each memory cell of data arrays $502_1, 502_2, \ldots, 502_N$, ECC arrays $504_1, 504_2, \ldots, 504_M$, read reference arrays $506_1, 506_2, \ldots, 506_J$, and write reference arrays $508_1, 508_2, \ldots, 508_K$ includes a magnetic memory element $M_x$ coupled in series with a selector element $S_x$, such as memory cell 222a of FIG. 2B. In an embodiment, each memory cell of read reference arrays $506_1, 506_2, \ldots, 506_J$ and write reference arrays $508_1, 508_2, \ldots, 508_K$ is initialized to have the magnetic memory element $M_x$ in the low resistance state.

In an embodiment, data are written to and read from memory system 500 in "access blocks." In an embodiment, each access block includes memory cells in each of data arrays $502_1, 502_2, \ldots, 502_N$, ECC arrays $504_1, 504_2, \ldots, 504_M$, read reference arrays $506_1, 506_2, \ldots, 506_J$, and write reference arrays $508_1, 508_2, \ldots, 508_K$. As used herein, an access block is also referred to as "write block" when used for writing data to memory system 500. As used herein, an access block is also referred to as "read block" when used for reading data from memory system 500.

Memory cells in an access block are in the same relative location in each of data arrays $502_1, 502_2, \ldots, 502_N$, ECC arrays $504_1, 504_2, \ldots, 504_M$, read reference arrays $506_1, 506_2, \ldots, 506_J$, and write reference arrays $508_1, 508_2, \ldots, 508_K$, and are referred to herein as "data memory cells," "ECC memory cells," "read reference memory cells," and "write reference memory cells," respectively.

For example, a first access block 510 includes first memory cells (also referred to herein as "data memory cells") $510a_1, 510a_2, \ldots 510a_N$ in data arrays $502_1, 502_2, \ldots, 502_N$, respectively, ECC memory cells $510b_1, 510b_2, \ldots 510b_M$ in ECC arrays $504_1, 504_2, \ldots, 504_M$, respectively, second memory cells (also referred to herein as "read reference memory cells") $510c_1, 510c_2, \ldots, 510c_J$ in read reference arrays $506_1, 506_2, \ldots, 506_J$, respectively, and third memory cells (also referred to herein as "write reference memory cells") $510d_1, 510d_2, \ldots 510d_K$ in write reference arrays $508_1, 508_2, \ldots, 508_K$, respectively. Each data memory cell, ECC memory cell, read reference memory cell, and write reference memory cell in first access block 510 is located in the same relative location within the corresponding memory array.

In the embodiment depicted in FIG. 5C, data memory cells $510a_1, 510a_2, \ldots 510a_N$ are located in the second column and ninth row of data arrays $502_1, 502_2, \ldots, 502_N$, respectively, ECC memory cells $510b_1, 510b_2, \ldots 510b_M$ are located in the second column and ninth row of ECC arrays $504_1, 504_2, \ldots, 504_M$, respectively, read reference memory cells $510c_1, 510c_2, \ldots 510c_J$ are located in the second column and ninth row of read reference arrays $506_1, 506_2, \ldots, 506_J$, respectively, and write reference memory cells $510d_1, 510d_2, \ldots 510d_K$ are located in the second column and ninth row of write reference arrays $508_1, 508_2, \ldots, 508_K$, respectively.

Second access block 512 includes data memory cells $512a_1, 512a_2, \ldots 512a_N$ in data arrays $502_1, 502_2, \ldots, 502_N$, respectively, ECC memory cells $512b_1, 512b_2, \ldots 512b_M$ in ECC arrays $504_1, 504_2, \ldots, 504_M$, respectively, read reference memory cells $512c_1, 512c_2, \ldots 512c_J$ in read reference arrays $506_1, 506_2, \ldots, 506_J$, respectively, and write reference memory cells $512d_1, 512d_2, \ldots 512d_K$ in write reference arrays $508_1, 508_2, \ldots, 508_K$, respectively. Each data memory cell, ECC memory cell, read reference memory cell, and write reference memory cell in second access block 512 is located in the same relative location within the corresponding memory array.

In the embodiment depicted in FIG. 5C, data memory cells $512a_1, 512a_2, \ldots 512a_N$ are located in the fourth column and third row of data arrays $502_1, 502_2, \ldots, 502_N$, respectively, ECC memory cells $512b_1, 512b_2, \ldots 512b_M$ are located in the fourth column and third row of ECC arrays $504_1, 504_2, \ldots, 504_M$, respectively, read reference memory cells $512c_1, 512c_2, \ldots 512c_J$ are located in the fourth column and third row of read reference arrays $506_1, 506_2, \ldots, 506_J$, respectively, and write reference memory cells $512d_1, 512d_2, \ldots 512d_K$ are located in the fourth column and third row of write reference arrays $508_1, 508_2, \ldots, 508_K$, respectively.

Each access block includes N data bits and M ECC bits. Thus, for example first access block 510 includes N data bits in data memory cells $510a_1, 510a_2, \ldots 510a_N$ and M ECC bits in ECC memory cells $510b_1, 510b_2, \ldots 510b_M$. Similarly, second access block 512 includes N data bits in memory cells $512a_1, 512a_2, \ldots 512a_N$ and M ECC bits in ECC memory cells $512b_1, 512b_2, \ldots 512b_M$.

Bits within an access block are located on different memory arrays, but are accessed substantially simultaneously. For example, data memory cells $510a_1, 510a_2, \ldots 510a_N$ in data arrays $502_1, 502_2, \ldots, 502_N$, respectively, and corresponding ECC memory cells $510b_1, 510b_2, \ldots, 510b_M$ in ECC arrays $504_1, 504_2, \ldots, 504_M$, respectively, are accessed (e.g., read or written) substantially simultaneously. As a result, without wanting to be bound by any particular theory, it is believed that all memory cells within an access block will have the same threshold and offset voltage time drift because the elapsed time since last access (e.g., read or write) will be substantially the same across all memory cells in the access block. In addition, all memory cells within an access block will have experienced an equivalent cycling history, thus history dependent drifts in cell properties will be nominally identical.

In an embodiment, when accessing (e.g., reading or writing) data memory cells and ECC memory cells in an access block, one or more read reference memory cells and one or more write reference memory cells in the same access block also are accessed. In an embodiment, the threshold voltages of one or more of the accessed read reference memory cells and one or more of the accessed write reference memory cells in the access block are determined, and the determined threshold voltages are used for adjusting read and write parameters for data memory cells and ECC memory cells in the access block.

In an embodiment, a threshold voltage determined from one or more read reference memory cells in an access block (referred to herein as a "read threshold voltage Vthr") is used to determine a read voltage Vread for data memory cells and ECC memory cells in the access block. Without wanting to be bound by any particular theory, it is believed that read threshold voltage Vthr tracks threshold voltage drift of data memory cells and ECC memory cells in the access block since the last read operation.

In an embodiment, a threshold voltage determined from one or more write reference memory cells in an access block (referred to herein as a "write threshold voltage Vthw") is used to determine a maximum write voltage Vmax for data memory cells and ECC memory cells in the access block.

Without wanting to be bound by any particular theory, it is believed that write threshold voltage Vthw tracks threshold voltage drift of data memory cells and ECC memory cells in the access block since the last write operation.

In an embodiment, when accessing (e.g., reading or writing) data memory cells and ECC memory cells in an access block, one or more read reference memory cells and one or more write reference memory cells in the same access block also are accessed. In an embodiment, the offset voltages (e.g., $V_{OFP}$ and $V_{OFN}$ in FIG. 2C) of one or more of the accessed read reference memory cells and one or more of the accessed write reference memory cells in the access block are determined, and the determined offset voltages are used for adjusting read and write parameters for data memory cells and ECC memory cells in the access block.

In an embodiment, an offset voltage determined from one or more read reference memory cells in an access block (referred to herein as a "read offset voltage Voffr") is used to determine a read voltage Vread for data memory cells and ECC memory cells in the access block. Without wanting to be bound by any particular theory, it is believed that read offset voltage Voffr changes in lock step with the offset voltages of data memory cells and ECC memory cells in the access since the last read operation.

In an embodiment, an offset voltage is determined from one or more write reference memory cells in an access block (referred to herein as a "write offset voltage Voffw") is used to determine write voltage Vset and Vreset for data memory cells and ECC memory cells in the access block. Without wanting to be bound by any particular theory, it is believed that write offset voltage Voffw tracks threshold voltage drift of data memory cells and ECC memory cells in the access block since the last write operation.

Figure 6A:
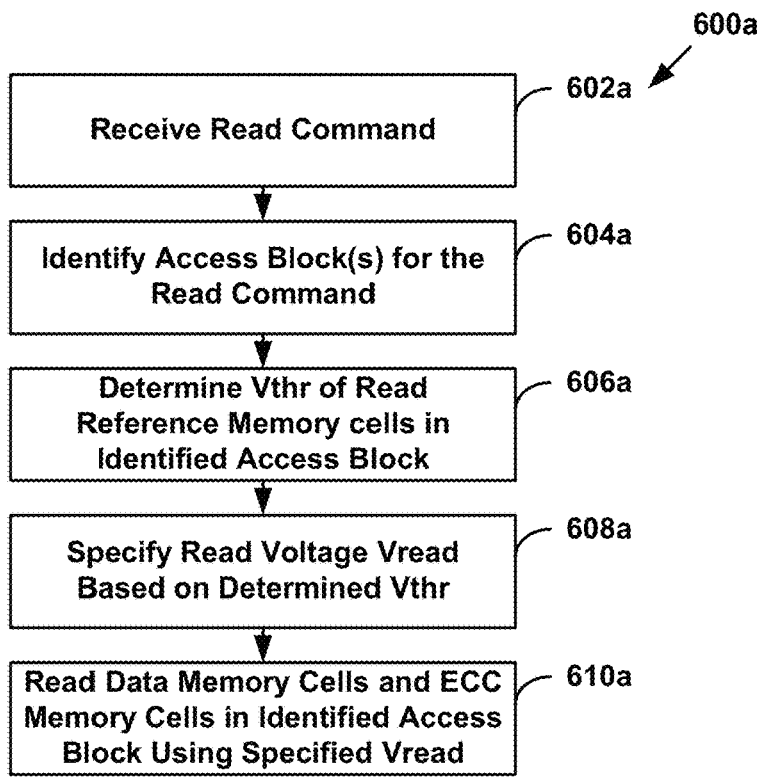
FIG. 6A is a flowchart of an example process for reading memory cells in an access block.

FIG. 6A is a flowchart of an example process 600a for reading data memory cells and ECC memory cells in an access block (e.g., first access block 510 and second access block 512 of FIGS. 5A-5B). In embodiments, process 600a may be implemented by memory chip controller 104 of FIG. 1A. At step 602a, a read command is received. For example, memory chip controller 104 may receive a read command from host 102 (FIG. 1A).

At step 604a, memory core control circuits 108 (FIG. 1A) identify the access block(s) that include data memory cells, ECC memory cells, read reference memory cells, and write reference memory cells specified by the read command. For simplicity, assume that memory core control circuits 108 identify a single access block (e.g., first access block 510 of FIGS. 5A-5B) that includes data memory cells (e.g., data memory cells $510a_1, 510a_2, \ldots 510a_N$) and ECC memory cells (e.g., ECC memory cells $510b_1, 510b_2, \ldots 510b_M$) specified by the read command.

At step 606a, a read threshold voltage Vthr is determined from one or more read reference memory cells in the identified access block. For example, a read threshold voltage Vthr is determined from one or more of read reference memory cells $510c_1, 510c_2, \ldots 510c_J$ in read reference arrays $506_1, 506_2, \ldots, 506_J$, respectively. A threshold voltage of a reversible resistance-switching memory cell may be determined by applying a voltage ramp to the memory cell while monitoring current flow through the memory cell. The value of the applied voltage upon detecting current flow is the threshold voltage of the memory cell.

In an embodiment, the read threshold voltage Vthr is determined as a threshold voltage of one or more of read reference memory cells $510c_1, 510c_2, \ldots 510c_J$. In another embodiment, the read threshold voltage Vthr is determined as an average of threshold voltages of read reference memory cells $510c_1, 510c_2, \ldots 510c_J$. In another embodiment, the read threshold voltage Vthr is determined as a median of the threshold voltages of read reference memory cells $510c_1, 510c_2, \ldots 510c_J$.

In another embodiment, rather than using voltage ramps to determine read threshold voltage Vthr, J distinct voltage values $V_1, V_2, V_3, \ldots, V_J$ are applied to read reference memory cells $510c_1, 510c_2, \ldots 510c_J$, respectively, while monitoring current flow through each of the memory cells. In an embodiment, the J distinct voltage values $V_1, V_2, V_3, \ldots, V_J$ span an empirically determined range of threshold voltage values for the memory cells. The read threshold voltage Vthr is determined as the lowest applied voltage value $V_1, V_2, V_3, \ldots, V_J$ that causes a read reference memory cell $510c_1, 510c_2, \ldots 510c_J$ to conduct current.

At step 608a, a read voltage Vread is calculated based on the read threshold voltage Vthr determined at step 606a. In an embodiment, Vread is calculated as Vread=α×Vthr, where a is a scalar value (e.g., 1.05<α<1.5). In another embodiment, Vread is calculated as Vread=Vthr+α, where α is a fixed voltage value (e.g. 0.25V<α<1.5V). Without wanting to be bound by any particular theory, it is believed that all data memory cells $510a_1, 510a_2, \ldots 510a_N$ and ECC memory cells $510b_1, 510b_2, \ldots 510b_M$ in first access block 510 will have nominally the same threshold voltage drift because the elapsed time since last read will be substantially identical across first access block 510.

At step 610a, data memory cells (e.g., data memory cells $510a_1, 510a_2, \ldots 510a_N$) and ECC memory cells (e.g., ECC memory cells $510b_1, 510b_2, \ldots 510b_M$) in the identified access block (e.g., first access block 510) are read using the read voltage Vread calculated in step 608a. Optionally, read reference memory cells (read reference memory cells $510c_1, 510c_2, \ldots 510c_J$) are also read at the same time as the data memory cells and ECC memory cells to ensure that the time elapsed since last access will be identical for all cells in future read events to the block.

Without wanting to be bound by any particular theory, it is believed that all data memory cells $510a_1, 510a_2, \ldots 510a_N$, all ECC memory cells $510b_1, 510b_2, \ldots 510b_M$, and all read reference memory cells $510c_1, 510c_2, \ldots 510c_J$, in first access block 510 will have the same threshold voltage drift because the elapsed time since last read will be substantially identical across first access block 510. Likewise, all write reference memory cells $510d_1, 510d_2, \ldots 510d_K$ will have the same threshold voltage drift as cells which that were either not read or only read in a manner that did not cause the selector to transition into the ON state.

In addition, without wanting to be bound by any particular theory, it is believed that all data memory cells $510a_1, 510a_2, \ldots 510a_N$, all ECC memory cells $510b_1, 510b_2, \ldots 510b_M$, all read reference memory cells $510c_1, 510c_2, \ldots 510c_J$, and all write reference memory cells $510d_1, 510d_2, \ldots 510d_K$ in first access block 510 will have substantially identical thermal load. As a result, without wanting to be bound by any particular theory, it is believed that the read threshold voltage Vthr determined at step 606a will include temperature-induced threshold voltage drift.

Figure 6B:
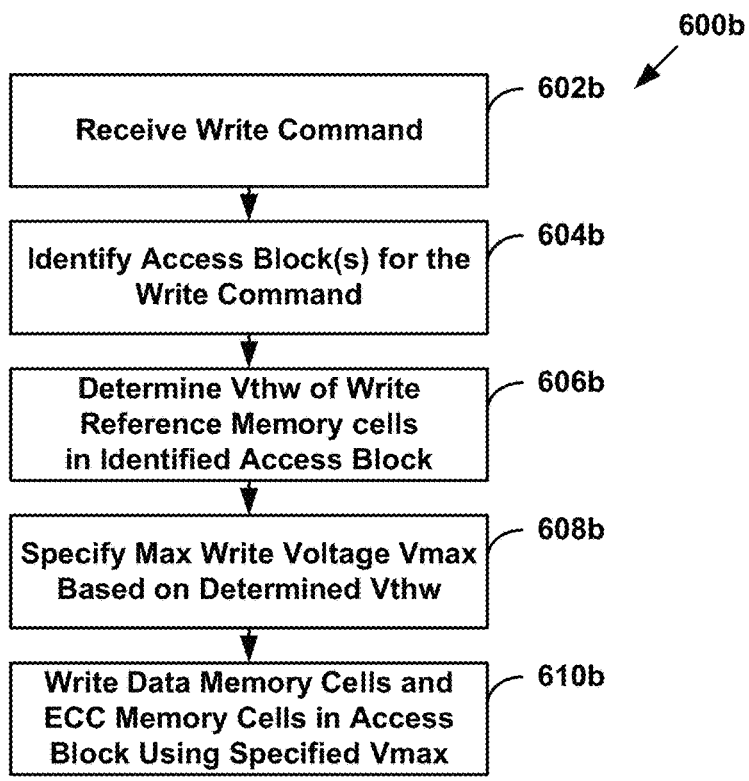
FIG. 6B is a flowchart of an example process for writing memory cells in an access block.

FIG. 6B is a flowchart of an example process 600b for writing data memory cells and ECC memory cells in an access block (e.g., first access block 510 and second access block 512 of FIGS. 5A-5B). In embodiments, process 600b may be implemented by memory chip controller 104 of FIG. 1A. At step 602b, a write command is received. For example, memory chip controller 104 may receive a write command from host 102 (FIG. 1A).

At step 604b, memory core control circuits 108 (FIG. 1A) identify the access block(s) that include data memory cells and ECC memory cells specified by the write command. For simplicity, assume that memory core control circuits 108 identify a single access block (e.g., second access block 512 of FIGS. 5A-5B) that includes data memory cells (e.g., data memory cells $512a_1, 512a_2, \ldots 512a_N$) and ECC memory cells (e.g., ECC memory cells $512b_1, 512b_2, \ldots 512b_M$) specified by the write command.

At step 606b, a write threshold voltage Vthw is determined from one or more write reference memory cells in the identified access block. For example, a write threshold voltage Vthw is determined from one or more of write reference memory cells $512d_1, 512d_2, \ldots, 512d_K$ in write reference arrays $508_1, 508_2, \ldots, 508_K$, respectively. A threshold voltage of a reversible resistance-switching memory cell may be determined by applying a voltage ramp to the memory cell while monitoring current flow through the memory cell. The value of the applied voltage upon detecting current flow is the threshold voltage of the memory cell.

In an embodiment, the write threshold voltage Vthw is determined as a threshold voltage of one or more of write reference memory cells $512d_1, 512d_2, \ldots 512d_K$. In another embodiment, the write threshold voltage Vthw is determined as an average of threshold voltages of write reference memory cells $512d_1, 512d_2, \ldots 512d_K$. In another embodiment, the write threshold voltage Vthw is determined as a median of the threshold voltages of write reference memory cells $512d_1, 512d_2, \ldots 512d_K$.

In another embodiment, rather than using voltage ramps to determine write threshold voltage Vthr, K distinct voltage values $V_1, V_2, V_3, \ldots, V_K$ are applied to write reference memory cells $512d_1, 512d_2, \ldots 512d_K$, respectively, while monitoring current flow through each of the memory cells. In an embodiment, the K distinct voltage values $V_1, V_2, V_3, \ldots, V_K$ span an empirically determined range of threshold voltage values for the memory cells. The write threshold voltage Vthw is determined as the lowest applied voltage value $V_1, V_2, V_3, \ldots, V_K$ that causes a write reference memory cell $512d_1, 512d_2, \ldots 512d_K$ to conduct current.

At step 608b, a maximum write voltage Vmax is calculated based on the write threshold voltage Vthw determined at step 606b. In an embodiment, Vmax is calculated as Vmax=β×Vthw, where β is a scalar value (e.g., 1<β<1.5). In another embodiment Vmax is calculated as Vmax=β+Vthw, where β is a voltage value (e.g., 0 V<β<2 V). Without wanting to be bound by any particular theory, it is believed that all data memory cells $512a_1, 512a_2, \ldots 512a_N$ and ECC memory cells $512b_1, 512b_2, \ldots 512b_M$ in second access block 512 that have not been accessed in a manner that switched the selector to the ON state, will have the same threshold voltage drift because the elapsed time since last write will be substantially identical across second access block 512.

At step 610b, data memory cells (e.g., data memory cells $512a_1, 512a_2, \ldots 512a_N$), ECC memory cells (e.g., ECC memory cells $512b_1, 512b_2, \ldots 512b_M$), write reference memory cells (e.g., write reference memory cells $512d_1, 512d_2, \ldots 512d_K$), and read reference memory cells (e.g., read reference memory cells $512C_1, 512C_2, \ldots 512C_J$) in the identified access block (e.g., second access block 512) are written, using a write voltage limited to the maximum write voltage Vmax calculated in step 608b.

Without wanting to be bound by any particular theory, it is believed that all data memory cells $512a_1, 512a_2, \ldots 512a_N$, all ECC memory cells $512b_1, 512b_2, \ldots 512b_M$, all read reference memory cells $512c_1, 512c_2, \ldots 512c_J$, and all write reference memory cells $512d_1, 512d_2, \ldots 512d_K$ in second access block 512 will have the same threshold voltage drift because the elapsed time since last write will be substantially identical across second access block 512.

In addition, without wanting to be bound by any particular theory, it is believed that all data memory cells $512a_1, 512a_2, \ldots 512a_N$, all ECC memory cells $512b_1, 512b_2, \ldots 512b_M$, all read reference memory cells $512c_1, 512c_2, \ldots 512c_J$, and all write reference memory cells $512d_1, 512d_2, \ldots 512d_K$ in second access block 512 will have substantially identical thermal load. As a result, without wanting to be bound by any particular theory, it is believed that the write threshold voltage Vthw determined at step 606b will include temperature-induced threshold voltage drift.

In addition, without wanting to be bound by any particular theory, it is believed that all data memory cells $512a_1, 512a_2, \ldots 512a_N$, all ECC memory cells $512b_1, 512b_2, \ldots 512b_M$, all read reference memory cells $512c_1, 512c_2, \ldots 512c_J$, and all write reference memory cells $512d_1, 512d_2, \ldots 512d_K$ in second access block 512 will have substantially identical number of read and write cycles, respectively. As a result, without wanting to be bound by any particular theory, it is believed that the write threshold voltage Vthw determined at step 606b will include aging related drifts due to repeated cycling.

Figure 7A:
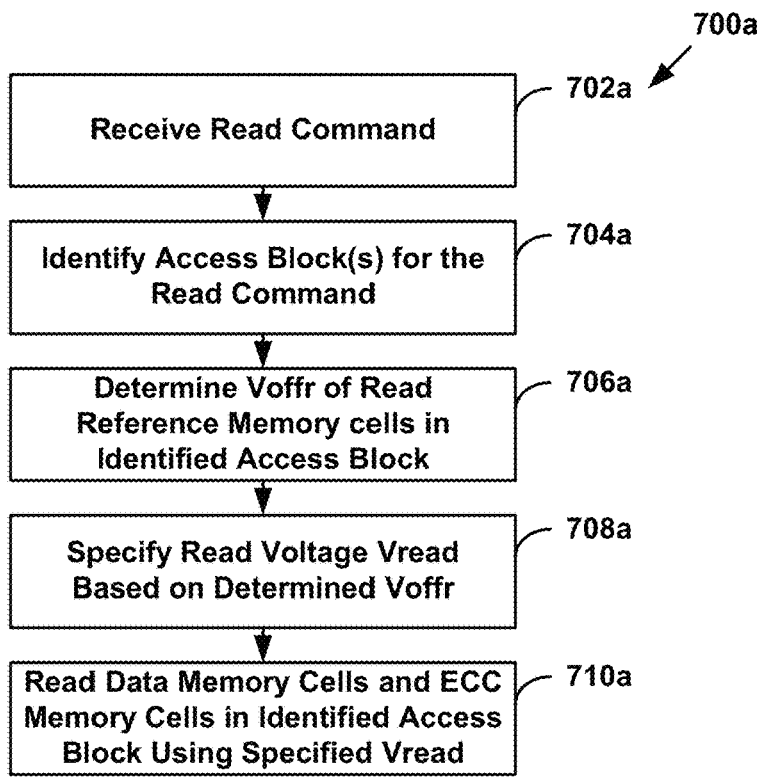
FIG. 7A is a flowchart of an example process for reading memory cells in an access block.

FIG. 7A is a flowchart of an example process 700a for reading data memory cells and ECC memory cells in an access block (e.g., first access block 510 and second access block 512 of FIGS. 5A-5B). In embodiments, process 700a may be implemented by memory chip controller 104 of FIG. 1A. At step 702a, a read command is received. For example, memory chip controller 104 may receive a read command from host 102 (FIG. 1A).

At step 704a, memory core control circuits 108 (FIG. 1A) identify the access block(s) that include data memory cells, ECC memory cells, read reference cells, and write reference cells specified by the read command. For simplicity, assume that memory core control circuits 108 identify a single access block (e.g., first access block 510 of FIGS. 5A-5B) that includes data memory cells (e.g., data memory cells $510a_1, 510a_2, \ldots 510a_N$) and ECC memory cells (e.g., ECC memory cells $510b_1, 510b_2, \ldots 510b_M$) specified by the read command.

At step 706a, a read offset voltage Voffr is determined from one or more read reference memory cells in the identified access block. For example, a read offset voltage Voffr is determined from one or more of read reference memory cells $510c_1, 510c_2, \ldots 510c_J$ in read reference arrays $506_1, 506_2, \ldots, 506_J$, respectively. An offset voltage of a reversible resistance-switching memory cell may be determined by applying a fixed voltage that exceeds the threshold voltage to the reference memory cell (e.g. Vapp=Vth*1.2) for a fixed time t_pulse (e.g., 5 ns<t_pulse<100 ns). The resulting current flow will depend on the offset voltage through the equation I_cell=(Vapp−Voffr)/(R_circuit+R_memory). With the circuit and memory element resistance known, the current can uniquely determine read offset voltage Voffr. The cell current can be measured by monitoring a voltage across a circuit resistor. In another embodiment the cell current is used to partially charge a capacitor. The resulting voltage on the capacitor will be related to I_cell, t_pulse, and the charging time constant. The offset voltage Voffr will be related to V_cap via a proportionality factor.

In an embodiment, the read offset voltage Voffr is determined as an offset voltage of one or more of read reference memory cells $510c_1, 510c_2, \ldots 510c_J$. In another embodiment, the read offset voltage Voffr is determined as an average of offset voltages of read reference memory cells $510c_1, 510c_2, \ldots 510c_J$. In another embodiment, the read offset voltage Voffr is determined as a median of offset voltages of read reference memory cells $510c_1, 510c_2, \ldots 510c_J$.

At step 708a, a read voltage Vread is calculated based on the read offset voltage Voffr determined at step 706a. In an embodiment, Vread is calculated as Vread=Vread0+Voffr−Voff0, where Vread0 and Voff0 are the nominal read voltages and offset voltages, respectively, in the absence of any changes of Voffset. Without wanting to be bound by any particular theory, it is believed that all data memory cells $510a_1, 510a_2, \ldots 510a_N$ and ECC memory cells $510b_1, 510b_2, \ldots 510b_M$ in first access block 510 will have nominally the same offset voltage drift because the elapsed time since last read will be substantially identical across first access block 510.

At step 710a, data memory cells (e.g., data memory cells $510a_1, 510a_2, \ldots 510a_N$) and ECC memory cells (e.g., ECC memory cells $510b_1, 510b_2, \ldots 510b_M$) in the identified access block (e.g., first access block 510) are read using the read voltage Vread calculated in step 708a. Optionally, the read reference cells are also read at the same time as the data and ECC memory cells to ensure that the time elapsed since last access will be identical for all cells in future read events to the block.

Without wanting to be bound by any particular theory, it is believed that all data memory cells $510a_1, 510a_2, \ldots 510a_N$, all ECC memory cells $510b_1, 510b_2, \ldots 510b_M$, all read reference memory cells $510c_1, 510c_2, \ldots 510c_J$, in first access block 510 will have the same offset voltage drift because the elapsed time since last read will be substantially identical across first access block 510. Likewise, all write reference memory cells $510d_1, 510d_2, \ldots 510d_K$ will have the same offset voltage drift as cells which that were either not read or only read in a manner that did not cause the selector to transition into the ON state.

In addition, without wanting to be bound by any particular theory, it is believed that all data memory cells $510a_1, 510a_2, \ldots 510a_N$, all ECC memory cells $510b_1, 510b_2, \ldots 510b_M$, all read reference memory cells $510c_1, 510c_2, \ldots 510c_J$, and all write reference memory cells $510d_1, 510d_2, \ldots 510d_K$ in first access block 510 will have substantially identical thermal load. As a result, without wanting to be bound by any particular theory, it is believed that the read offset voltage Voffr determined at step 706a will include temperature-induced offset voltage drift.

Figure 7B:
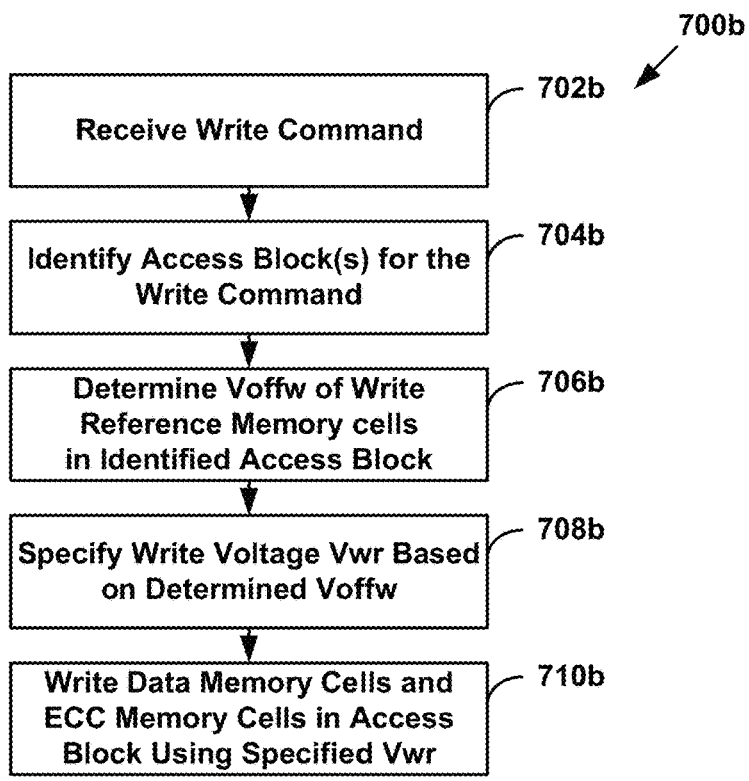
FIG. 7B is a flowchart of an example process for writing memory cells in an access block.

FIG. 7B is a flowchart of an example process 700b for writing data memory cells and ECC memory cells in an access block (e.g., first access block 510 and second access block 512 of FIGS. 5A-5B). In embodiments, process 700b may be implemented by memory chip controller 104 of FIG. 1A. At step 702b, a write command is received. For example, memory chip controller 104 may receive a write command from host 102 (FIG. 1A).

At step 704b, memory core control circuits 108 (FIG. 1A) identify the access block(s) that include data memory cells and ECC memory cells specified by the write command. For simplicity, assume that memory core control circuits 108 identify a single access block (e.g., second access block 512 of FIGS. 5A-5B) that includes data memory cells (e.g., data memory cells $512a_1, 512a_2, \ldots 512a_N$) and ECC memory cells (e.g., ECC memory cells $512b_1, 512b_2, \ldots 512b_M$) specified by the write command.

At step 706b, a write offset voltage Voffw is determined from one or more write reference memory cells in the identified access block. For example, a write offset voltage Voffw is determined from one or more of write reference memory cells $512d_1, 512d_2, \ldots 512d_K$ in write reference arrays $508_1, 508_2, \ldots, 508_K$, respectively. The write offset voltage can be determined in the same manner as described above for determining the read offset voltage.

In an embodiment, the write offset voltage Voffw is determined as an offset voltage of one or more of write reference memory cells $512d_1, 512d_2, \ldots 512d_K$. In another embodiment, the write offset voltage Voffw is determined as an average of offset voltages of write reference memory cells $512d_1, 512d_2, \ldots 512d_K$. In another embodiment, the write offset voltage Voffw is determined as a median of offset voltages of write reference memory cells $512d_1, 512d_2, \ldots 512d_K$.

At step 708b, a write voltage Vwr is calculated based on the write offset voltage Voffw determined at step 706b. In one embodiment Vwr is calculated as Vwr=Vwr0+Voffw−Voff0, where Vwr0 and Voff0 are the nominal write and offset voltages, respectively, assuming no drift. Without wanting to be bound by any particular theory, it is believed that all data memory cells $512a_1, 512a_2, \ldots 512a_N$ and ECC memory cells $512b_1, 512b_2, \ldots 512b_M$ in second access block 512 that have not been accessed in a manner that switched the selector to the ON state, will have the same offset voltage drift because the elapsed time since last write will be substantially identical across second access block 512.

At step 710b, data memory cells (e.g., data memory cells $512a_1, 512a_2, \ldots 512a_N$), ECC memory cells (e.g., ECC memory cells $512b_1, 512b_2, \ldots 512b_M$), write reference cells, and read reference cells in the identified access block (e.g., second access block 512) are written, using a write voltage calculated in step 708b.

The read voltage polarity can be either positive or negative, depending on which polarity is desirable from a cell design or read error rate margin perspective. Likewise, the write voltage polarities can be either negative or positive, depending on cell design and the desired memory state after write. The threshold and offset voltages can have a polarity dependence. As such, the read reference cells should be read with the same polarity as the read polarity of the memory and ECC cells. In one embodiment two different sets of write reference cells are employed to measure both offset voltages and/or threshold voltages in negative and positive polarities.

One embodiment of the disclosed technology includes a memory system that includes a first memory array including a first memory cell, a second memory array including a second memory cell, and a memory controller configured to determine a threshold voltage of the second memory cell to compensate a drift of a threshold voltage of the first memory cell and/or determine an offset voltage of the second memory cell to compensate an offset voltage of the first memory cell.

One embodiment of the disclosed technology includes an apparatus that includes data arrays each including first memory cells, read reference arrays each including second memory cells, write reference arrays each including third memory cells, an access block, and a memory controller. The access block includes a memory cell from each of the data arrays, each of the read reference arrays, and each of the write reference arrays. The memory controller is configured to determine a read threshold voltage to compensate a drift of a threshold voltage of the first memory cells. The memory controller also is configured to determine an offset voltage to compensate an offset voltage of the first memory cells. The read threshold voltage is determined based on threshold voltages of multiple second memory cells, and the offset voltage is determined based on offset voltages of multiple second memory cells.

One embodiment of the disclosed technology includes a method that includes determining a threshold voltage of a reference memory cell of a reference array, the reference memory cell corresponding to a data memory cell of a data array, and specifying a read voltage for reading the data memory cell based on the determined threshold voltage.

For the purposes of this document, the reference cells used for determining threshold voltage and the reference cells used for determining offset voltage are not distinguished. In one embodiment, the offset voltage reference cells and threshold voltage reference cells are different.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. Apparatus comprising:
 a plurality of data arrays each comprising first memory cells;
 a plurality of read reference arrays each comprising second memory cells;
 a plurality of write reference arrays each comprising third memory cells;
 an access block comprising a memory cell from each of the plurality of data arrays, each of the plurality of read reference arrays, and each of the plurality of write reference arrays; and
 a memory controller configured to determine:
  a read threshold voltage to compensate a drift of a threshold voltage of the first memory cells, wherein the read threshold voltage is determined based on threshold voltages of a plurality of second memory cells; and
  a read offset voltage to compensate an offset voltage of the first memory cells, wherein the read offset voltage is determined based on offset voltages of a plurality of second memory cells.

2. The apparatus of claim 1, wherein the first memory cells, the second memory cells and the third memory cells each comprise a reversible resistance-switching memory element coupled in series with a selector element.

3. The apparatus of claim 1, wherein the first memory cells, the second memory cells and the third memory cells each comprise one or more of a magnetoresistive random access memory element, a phase change memory element, and a reversible resistance-switching random access memory element.

4. The apparatus of claim 1, wherein the first memory cells, the second memory cells and the third memory cells each comprise one or more of a threshold selector device, a conductive bridge threshold selector device, an ovonic threshold switch, and a Metal Insulator Transition of a Phase Transition Material type threshold selector device.

5. The apparatus of claim 1, wherein the memory controller is further configured to adjust a read voltage used to read the first memory cells based on one or more of the determined read threshold voltage and the determined read offset voltage.

6. The apparatus of claim 1, wherein the memory controller is further configured to determine the read threshold voltage as an average of the threshold voltages of the plurality of second memory cells.

7. The apparatus of claim 1, wherein the memory controller is further configured to determine the read offset voltage as an average of the offset voltages of the plurality of second memory cells.

8. The apparatus of claim 1, wherein the memory controller is further configured to determine a write threshold voltage to compensate a drift of threshold voltages of the first memory cells, wherein the write threshold voltage is determined based on threshold voltages of a plurality of third memory cells.

9. The apparatus of claim 8, wherein the memory controller is further configured to adjust a maximum write voltage used to write the first memory cells based on the determined write threshold voltage.

10. The apparatus of claim 1, wherein the memory controller is further configured to determine a write offset voltage to compensate a drift of offset voltages of the first memory cells, wherein the write offset voltage is determined based on offset voltages of a plurality of third memory cells.

11. The apparatus of claim 10, wherein the memory controller is further configured to adjust a maximum write voltage used to write the first memory cells based on the determined write offset voltage.

12. The apparatus of claim 1, wherein the memory controller is further configured to compensate for temperature-induced drift of one or more of the threshold voltage and the offset voltage of the first memory cells.

13. The apparatus of claim 1, wherein the memory cells in the access block are in a same relative location in each of the data arrays, the read reference arrays, and the write reference arrays.

14. Apparatus comprising:
a plurality of data arrays each comprising first memory cells;
a plurality of read reference arrays each comprising second memory cells;
an access block comprising a memory cell from each of the plurality of data arrays, and each of the plurality of read reference arrays; and
a memory controller configured to determine a read threshold voltage to compensate a drift of a threshold voltage of the first memory cells, wherein the read threshold voltage is determined based on threshold voltages of a plurality of second memory cells.

15. The apparatus of claim 14, wherein the first memory cells and the second memory cells each comprise one or more of a magnetoresistive random access memory element, a phase change memory element, and a reversible resistance-switching random access memory element.

16. The apparatus of claim 14, wherein the first memory cells and the second memory cells each comprise one or more of a threshold selector device, a conductive bridge threshold selector device, an ovonic threshold switch, and a Metal Insulator Transition of a Phase Transition Material type threshold selector device.

17. The apparatus of claim 14, wherein the memory controller is further configured to adjust a read voltage used to read the first memory cells based on the determined read threshold voltage.

18. Apparatus comprising:
a plurality of data arrays each comprising first memory cells;
a plurality of read reference arrays each comprising second memory cells;
an access block comprising a memory cell from each of the plurality of data arrays, and each of the plurality of read reference arrays; and
a memory controller configured to determine a read offset voltage to compensate a drift of an offset voltage of the first memory cells, wherein the read offset voltage is determined based on offset voltages of a plurality of second memory cells.

19. The apparatus of claim 18, wherein the first memory cells and the second memory cells each comprise one or more of a magnetoresistive random access memory element, a phase change memory element, and a reversible resistance-switching random access memory element.

20. The apparatus of claim 18, wherein the first memory cells and the second memory cells each comprise one or more of a threshold selector device, a conductive bridge threshold selector device, an ovonic threshold switch, and a Metal Insulator Transition of a Phase Transition Material type threshold selector device.

* * * * *